United States Patent [19]

Gratke

[11] Patent Number: 4,857,684

[45] Date of Patent: Aug. 15, 1989

[54] CAPACITANCE MEMBRANE SWITCHCORE WITH INTERTRACE CAPACITIVE COUPLING AND/OR INTRATRACE CAPACITIVE COUPLING

[75] Inventor: Norman G. Gratke, Elm Grove, Wis.

[73] Assignee: W. H. Brady Co., Milwaukee, Wis.

[21] Appl. No.: 262,906

[22] Filed: Oct. 25, 1988

[51] Int. Cl.$^4$ .................. H03K 17/975; H03M 11/00
[52] U.S. Cl. ........................................ 200/600; 341/33
[58] Field of Search ............... 200/5 A, 52 R, 600, 200/292; 341/33; 361/288

[56] References Cited

U.S. PATENT DOCUMENTS

| | | | |
|---|---|---|---|
| 4,400,758 | 8/1983 | Frame | 200/600 |
| 4,562,315 | 12/1985 | Aufderheide | 200/5 A |
| 4,736,076 | 4/1988 | Mochizuki et al. | 200/600 |
| 4,803,315 | 2/1989 | Kako et al. | 200/5 A |

Primary Examiner—J. R. Scott
Attorney, Agent, or Firm—Quarles & Brady

[57] ABSTRACT

A capacitance membrane switchcore (12,12a, 12b, 12c, 12c') including a first circuit (16, 16'), a second circuit (17,17') and a third circuit (49,49') in which intertrace coupling capacitors (58,58') couple conductive traces (40–47,135) of the second circuit (17,17') to conductive traces (51,51') of the third circuit (49,49'). Also disclosed is a capacitance membrane switchcore (12) including a first circuit (16) having at least one trace (65) with a first branch (65a) along a first surface (18a) of a dielectric layer (18), a second branch (65b) along a second surface (18b) of the dielectric layer (18), an intratrace coupling capacitor (66,67) coupling the first branch (65a) to the second branch (65b), a third branch (65c) along the first surface (18a) of the dielectric layer (18), and an intratrace coupling capacitor (68,69) coupling the second branch (65b) to the third branch (65c).

39 Claims, 10 Drawing Sheets

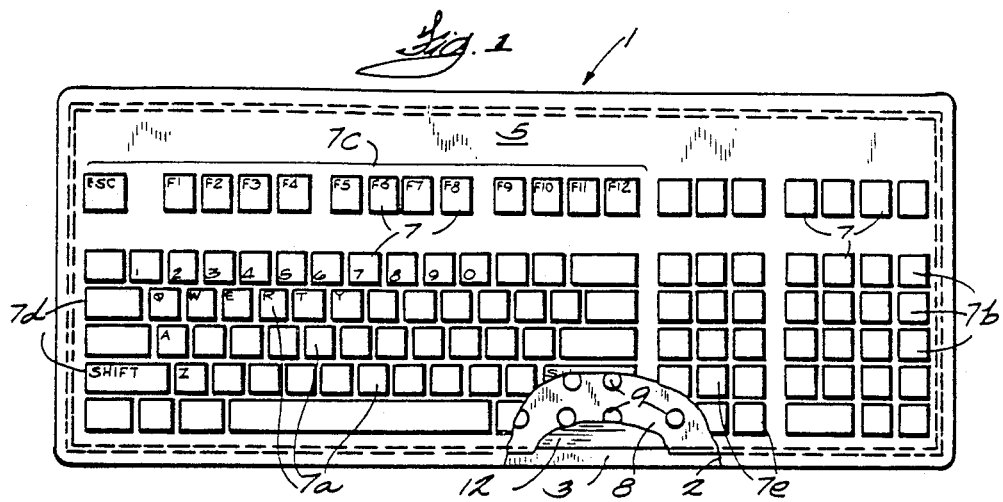

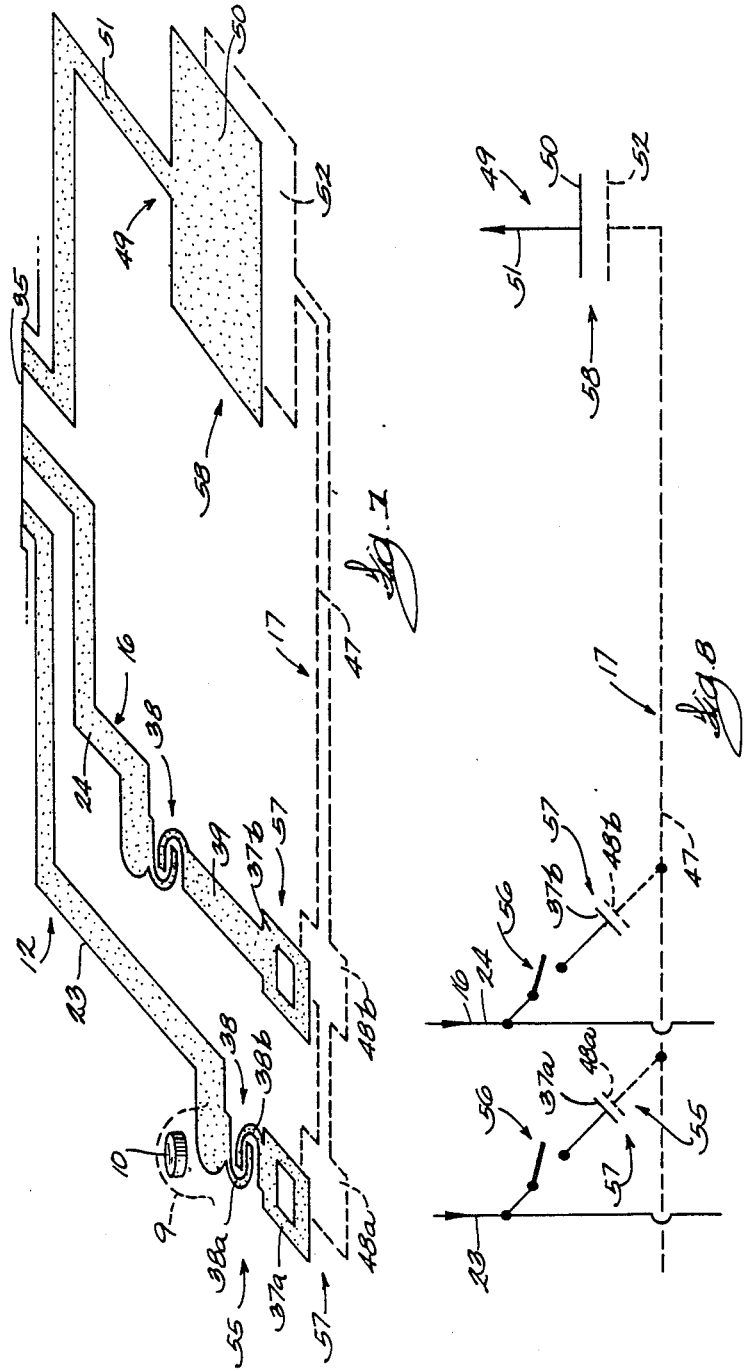

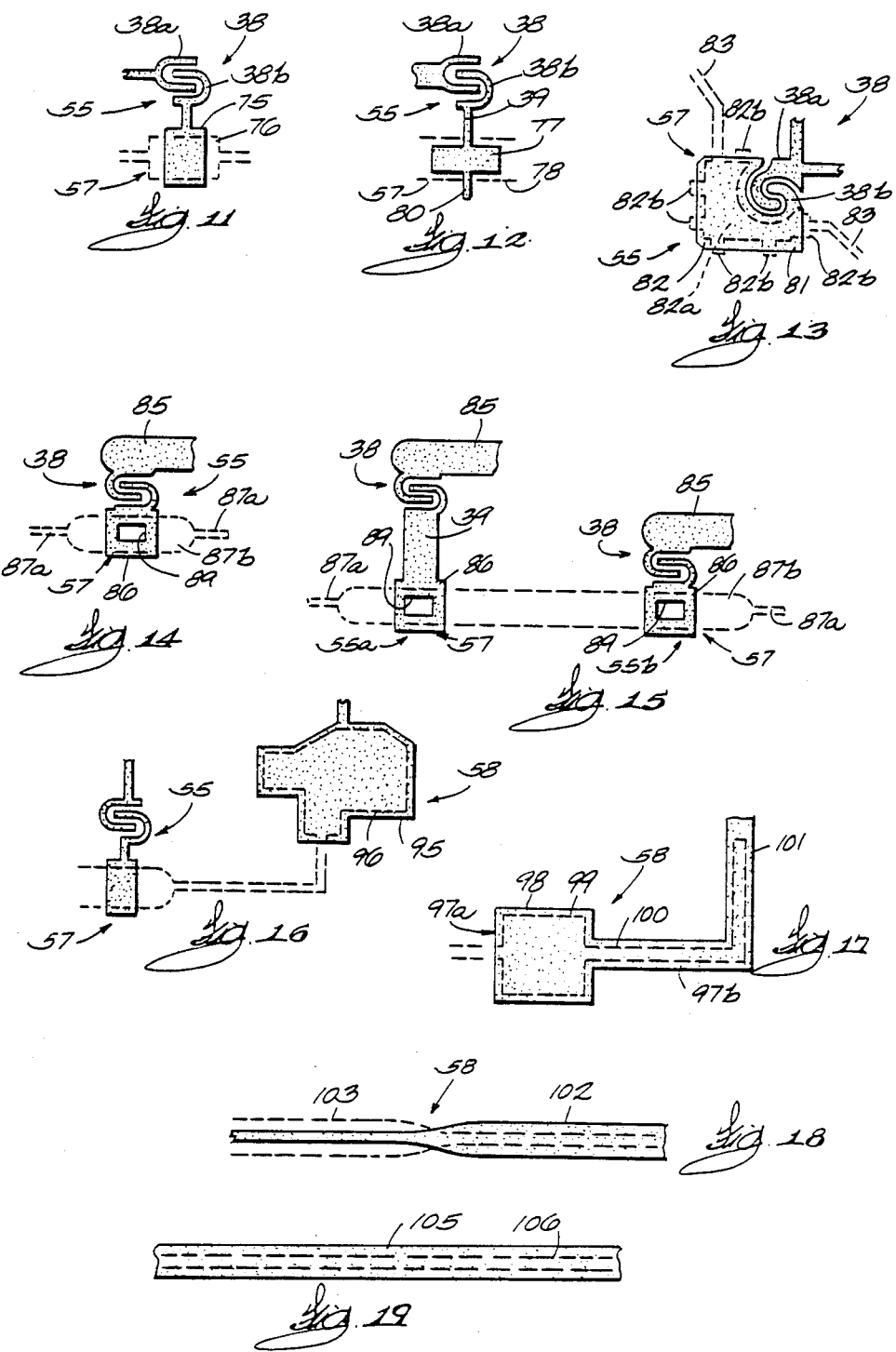

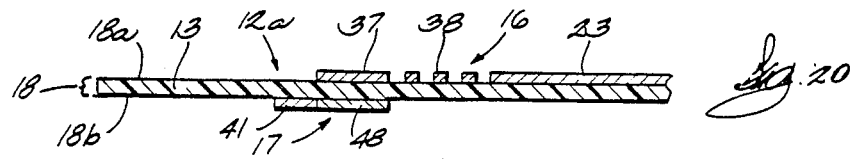
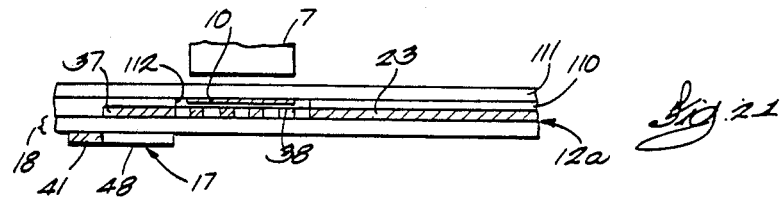
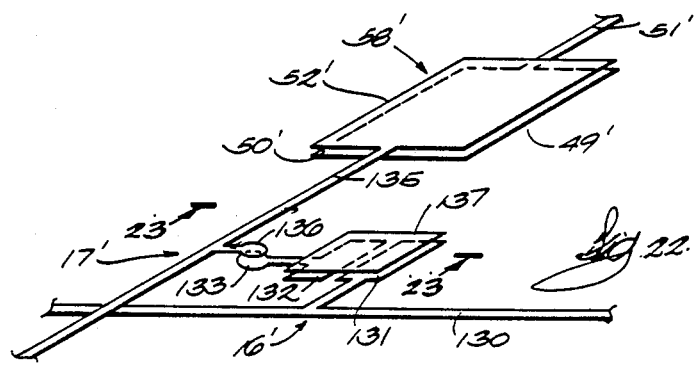
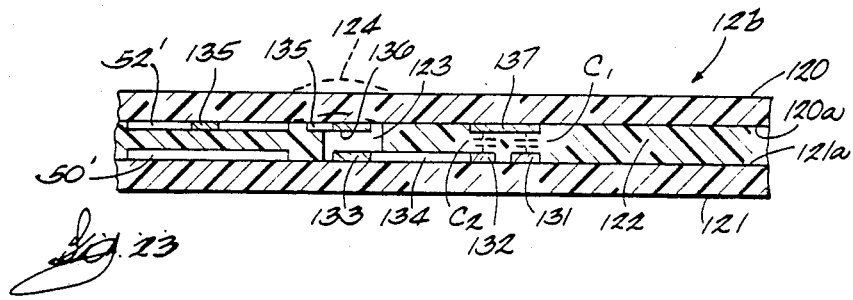
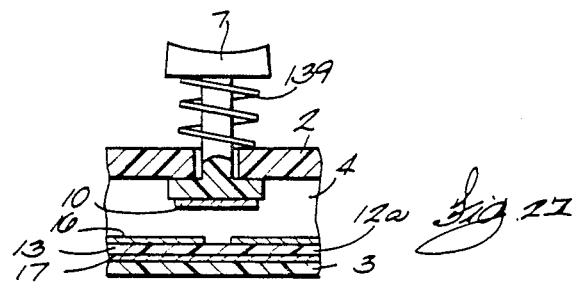

CAPACITANCE MEMBRANE SWITCHCORE WITH INTERTRACE CAPACITIVE COUPLING AND/OR INTRATRACE CAPACITIVE COUPLING

BACKGROUND OF THE INVENTION

This invention relates to capacitance membrane switchcores that may be used with a keyboard for data entry apparatus, such as a computer terminal, word processor, etc., of the type comprising appropriate conductive circuits carried on flexible plastic film membranes.

An electronic keyboard is an essential user interface device required for the input of information for many types of data processing systems. The principal elements of the keyboard comprise keys supported for actuation by an operator, an array of switches to develop an electrical signal in response to actuation of the keys, and electronic circuitry associated with the switch array for detecting the actuation of an individual key. The associated circuitry typically includes drive means for scanning the switch array at a high rate and sense means for detecting the change in an electric characteristic upon closure of a specific switch by manual actuation of the key.

The switch array for a state of the art keyboard is now generally a membrane switchcore comprising a laminated structure of two thin flexible plastic films, each carrying selected circuitry applied thereto by printing or vacuum deposition techniques. Flexible plastic film membrane switchcores of this type are to a large extent replacing circuit boards of hard rigid plastic such as phenolic or epoxied fiberglass on which the circuits are formed by metal plating and etching methods, as had been in common use prior to the development of flexible membrane elements. The membrane switch array may be either of the contact type or of the capacitance type. In a contact switch array, one set of contacts comprising a switch is connected across each crosspoint in the array. As is known in the art, a contact switch is easily decoded with direct current (DC) drive and sense signals, but cannot be accurately decoded if more than two keys are depressed simultaneously. The latter limitation is referred to as "2-key rollover", and is a result of phantom paths created with multiple key depression.

Capacitance type switch arrays include one or more capacitors at each crosspoint in the array and operate by presenting a change in the capacitance value at a crosspoint in response to actuation of the associated key. Upper and lower conductive circuits are spaced from and separated from one another by a dielectric layer, and are used to interconnect the various capacitor plates to drive and sense lines. The drive and sense circuitry means connected to the capacitance membrane switchcore are designed to charge each key cell capacitor by an alternating, or pulse current source, ascertain the net capacitance by known techniques at a key cell, and determine whether the capacitance value is high or low relative to a reference value, so as to thereby sense key actuation. The means to achieve a change in capacitance across a crosspoint may comprise either a variable capacitor or a combination of a fixed capacitor in series with a conventional contact switch.

Variable capacitance type switch arrays can be characterized as including at least one moving plate, in which the change in capacitance is achieved by physically moving a capacitor plate at a crosspoint; this is usually accomplished by utilizing the actuation force to deflect a capacitor plate located on a flexible membrane or on a key. In other types of variable capacitance switch arrays, e.g. a rigid, movable plate is linked to the key actuating means to define a variable capacitor which may be electrically in series with a second fixed capacitor at each crosspoint. The second, fixed capacitor may also be used in conjunction with a variable capacitor membrane switch array. The other type of capacitance switch array (e.g. fixed capacitor/contact switch) comprises a fixed capacitance in series with a conventional contact switch across each crosspoint in the array. The switch is closed when a key is actuated and the associated fixed capacitor is thereby connected across the crosspoint; the fixed capacitor is effectively removed and the crosspoint open when the key is released. Capacitance switch arrays can also be classified as "open" or "closed" depending upon whether one of the circuits, usually the upper circuit of the array, is open to the environment or closed from the environment.

Capacitance membrane switchcores exhibit numerous operational advantages as compared to contact membrane elements. Capacitance arrays are preferred in applications where multiple key rollover is desired because the phantom paths can be suppressed by known decoding techniques. Another advantage of capacitance arrays is that since alternating current (AC) signals are used in decoding the capacitive elements, a complete conductive path is not required, which provides greater reliability and longer life as compared to contact switch arrays.

However, capacitance membrane switchcores present several difficulties, in part resulting from the spatial relationship of two separate circuits, which have inhibited their widespread use in keyboards. One of these is the requirement to supply drive signals to one of the conductive circuits of the switchcore and sense capacitance changes from the other conductive circuit; this causes several problems since the two conductive circuits are located along opposite surfaces of a dielectric layer. Another is that the open capacitance membrane switchcores of the type now known in the art are more expensive to manufacture than contact membrane switchcores due to the additional processing steps required by the nature of their structure. Specifically, trace layout is difficult or impossible to accomplish without a means for establishing connections between trace layers. In prior open capacitance switchcores, such connections required die cutting of apertures through the insulating layers to establish physical contact between trace layers. This problem is prevalent in both open and closed capacitance membrane switchcores, as well as contact membrane switchcores. Further, the routing of conductive elements of circuits of a capacitance membrane switchcore can present a designer with problems not found in contact membrane switchcores for example, the effects of stray capacitance. The prior art techniques for resolving these and other problems associated with the design and manufacture of capacitance membrane switchcores have not resulted in optimum utilization of their desirable characteristics; hence, there is a need for further advancement in the development of capacitance membrane switchcores and this invention was conceived as a fresh approach in this art.

My present invention provides a capacitance membrane switchcore of the type having first and second conductive circuits along opposite surfaces of a dielectric layer. Each circuit includes a plurality of conductive traces and a plurality of capacitor plates connected to each trace to define a switch matrix including a fixed capacitor having a capacitor plate from each circuit that is unique to each key cell of the matrix. In one of its aspects, my invention provides a conductive third circuit including capacitor plates and traces that is physically independent of the first and second circuits but located along the same surface of the dielectric layer as one of said circuits wherein the third circuit includes capacitor plates aligned with capacitor plates of one of the other circuits in such manner as to provide intertrace capacitive coupling therewith; conductive traces of the third circuit extend from its capacitor plates for connection to external electronic circuitry. This feature of the invention provides a capacitance membrane switchcore in which conductive traces that are to be connected to drive and sense circuits are all located along the same surface of the dielectric layer. In another aspect, my invention is concerned with a construction for conductive traces of a circuit of the switchcore wherein a trace may extend partway along a first surface of the dielectric layer, have one or more branches located along the opposite second surface of the dielectric layer, and then return to the first surface of the dielectric layer, wherein the several branches of the trace are coupled to one another by means of intratrace capacitive coupling.

BRIEF DESCRIPTION OF THE DRAWING

These and other features, objectives and advantages of the invention will be made apparent in the description which follows that sets forth several exemplary capacitance membrane switch switchcores incorporating the concepts of the invention. The description is made by reference to the accompanying drawings, wherein:

FIG. 1 is a plan view, with a portion broken away, of a keyboard incorporating a capacitance membrane switchcore of the invention;

FIG. 2 is a side view of the keyboard of FIG. 1, with a portion broken away and with certain elements shown in cross section;

FIG. 3 is a sectional view of a portion of the capacitance membrane switchcore;

FIG. 7 is a schematic representation of portions of the capacitance membrane switchcore showing the spatial relationship between the circuits to illustrate intertrace capacitance coupling in accordance with the invention;

FIG. 8 is an electrical schematic of the circuit elements show in FIG. 7;

FIGS. 11–15 illustrate various configurations of key cell structure as additional exemplary forms thereof that may be employed in a capacitance membrane switchcore the invention;

FIGS. 16–19 illustrate various configurations of intertrace capacitive couplings as additional exemplary forms thereof that may be employed in a capacitance membrane switchcore of the invention;

FIG. 20 is a sectional view of a second form of capacitance membrane switchcore;

FIG. 21 is a sectional view of the capacitance membrane switchcore of FIG. 20 in a closed structure;

FIG. 22 is a schematic perspective view of a third form of capacitance membrane switchcore;

FIG. 23 is a sectional view of a capacitance membrane switchcore of the type illustrated in FIG. 22;

FIG. 26$a$ is a sectional view similar to FIG. 26 of an alternate construction for the switchcore of FIGS. 24 and 25;

FIG. 27 is a sectional view of an alternate key structure that can be used with capacitance membrane switchcores of the invention.

Figure 4:
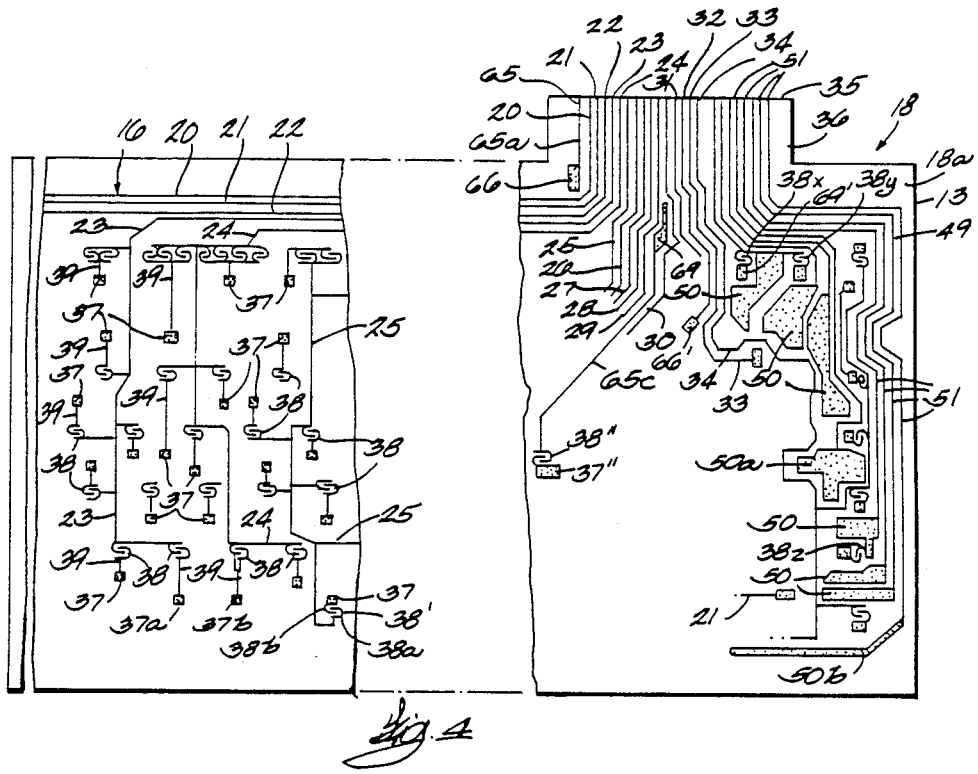
FIG. 4 is a plan view of the conductive circuitry along one surface of the dielectric layer of the switchcore.

DESCRIPTION OF THE PREFERRED EMBODIMENTS (a) FIGS. 1–3.

FIGS. 1 and 2 illustrate an exemplary full travel keyboard 1, such as may be employed for a computer terminal, comprising a cover 2 attached to a base 3 to form an enclosed housing 4, the cover 2 including a top panel 5 and a side panel 6 extending from each of the four sides of the top panel.

Manually reciprocable keys 7 are supported along the top panel 5 of the housing, some of which, keys 7$a$, are arranged in a standard "qwerty" pattern and marked with the usual alphanumeric designations such as letters, numerals and punctuation marks for this type of keyboard. Another group of keys 7 are located at the right hand side of the keyboard in a calculator array for mathematical functions, which are identified as keys 7$b$. A horizontal row of keys 7$c$ along the top of the keyboard keys, such as F1–F12 for example, and additional function keys are located at other positions on the keyboard such as keys 7$d$ and 7$e$.

An elastomeric element 8 is positioned inside the housing of the keyboard immediately under the keys 7. Elastomeric element 8 is a sheet-like member that is formed to have a plurality of resilient domes 9; there is at least one dome 9 located under each key, with there being two domes 9 under some of the longer keys such as those identified as "shift" keys in FIG. 1. A conductive contact 10 is attached to the top of the interior surface of each dome 9 as illustrated in the sectional view of FIG. 2 with respect to dome 9$a$. The distal end 11 of a key 7 touches a dome 9 when the key is in its deactuated condition, as shown with dome 9$b$ in FIG. 2. A resilient dome 9 is depressed or flattened to move a contact 10 downwards when an operator presses a key downwards, and the dome returns to its upright condition when the key is released so as to move a contact 10 upwards; the contacts 10 thereby comprise key actuated reciprocable contacts.

A capacitance membrane switchcore 12 is located immediately under the elastomeric element 8, and rests on the inner surface of base 3 of the housing of the keyboard. The present invention is concerned with new circuitry structure for the capacitance membrane switchcore 12 that is described in detail in the following parts of this description. Briefly, capacitance membrane switchcore 12, see FIG. 3, comprises a thin dielectric film layer 13 joined to a film substrate 14 by an adhesive layer 15 that is a thin layer of nonconductive adhesive. Switchcore 12 further includes a conductive upper or first circuit 16 and a conductive lower or second circuit 17 spaced from one another by a dielectric layer 18 which is defined by film layer 13 and adhesive layer 15. In this first embodiment, the first circuit 16 is along upper surface 18a of dielectric layer 18, and second circuit 17 is on upper surface 14a of substrate 14 so as to be along the bottom surface 18b of the dielectric layer. The upper and lower circuits 16 and 17, respectively, define a matrix including a fixed capacitor at each key cell. The capacitance membrane switchcore 12 is connected to suitable electronic circuitry including drive circuitry for supplying a drive signal to the matrix and sense circuitry for detecting a change in capacitance at a key cell when a particular key is actuated. The electronic circuitry, not shown, comprises appropriate microcomputer, clock, decoder, comparator chips and the like which may be located along the upper section of the interior of the housing 4.

Figure 5:
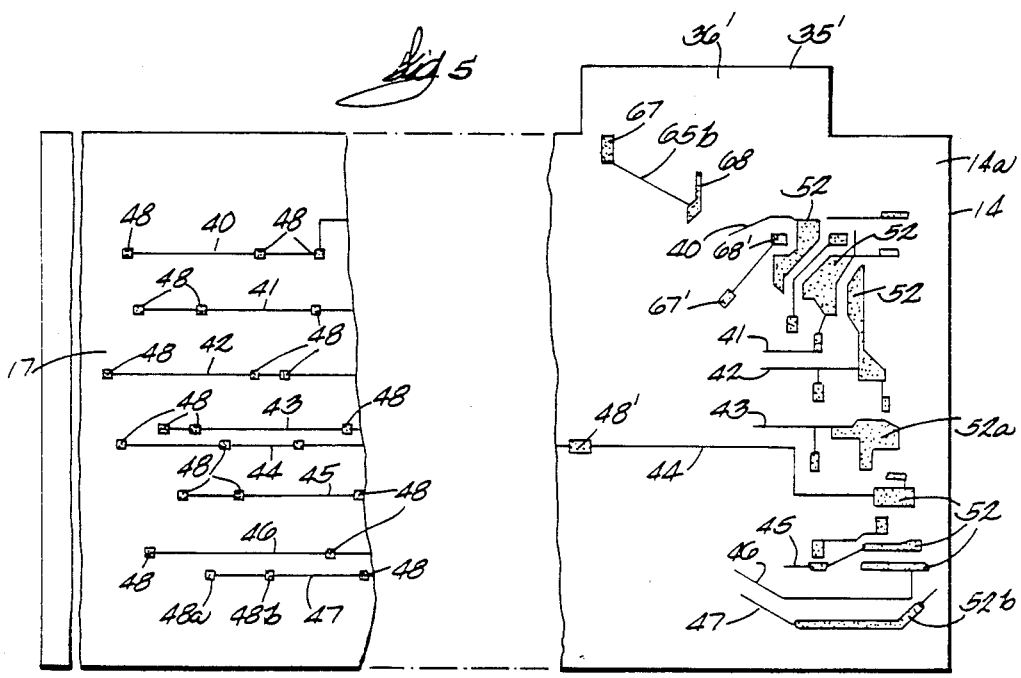
FIG. 5 is a plan view illustrating the conductive circuitry along the surface of the dielectric layer opposite from that of FIG. 4.

(b) FIGS. 4 and 5.

FIG. 4 illustrates first circuit 16 of capacitance membrane switchcore 12 that is defined along first or upper surface 18a of dielectric layer 18. First circuit 16 includes a plurality of conductive first traces 20–34, there being fifteen such first traces in the circuit. Traces 23, 24, 25 and 34 are shown in detail in FIG. 4, the other traces being similar. Each first trace extends along the surface 18a in a generally columnar arrangement and also extends to an edge 35 of the dielectric layer, which ay be formed to define a tail 36 for connection to the external drive and sense circuitry. Each first trace 20–34 includes a plurality of first capacitor plates 37, there being at least one first capacitor plate 37 for each key cell in the matrix. Each first capacitor plate 37 is electrically connected in series with a stationary contact 38; some plates are connected to a contact 38 by a conductive lead 39 to properly position a plate 38 relative to the second circuit as described in the next paragraph. The stationary contacts are positioned along a first trace such that there will be at least one stationary contact 38 located under each key 7 of the keyboard. Each stationary contact 38 consists of a pair of spaced contact elements 38a and 38b, with element 38a connected to a trace and 38b connected to a first capacitor plate 37, see stationary contact 38'. Contact elements 38a and are to be bridged by a reciprocable contact 10 when a key 7 is actuated. First capacitor plates 37 and stationary contacts 38 are illustrated in simplified form in FIG. 4 for clarity of description, and their configurations will be described in detail later in this description.

Second circuit 17, which is carried on upper surface 14a of substrate 14 and located along the bottom surface of dielectric layer 18 so as to be spaced from the first circuit 16 by the thickness of the dielectric layer, is illustrated in FIG. 5. The second circuit 17 comprises a plurality of conductive second traces 40–47 each of which extends in a generally row arrangement along the lower surface of the dielectric layer. A plurality of second capacitor plates 48 are electrically connected to each conductive second trace 40–47; the second capacitor plates 48 are illustrated schematically in FIG. 5 for clarity of the description and specific structures are described hereinafter. The first circuit 16 and second circuit 17 are arranged along opposite surfaces of dielectric layer 18 with a first capacitor plate 37 electrically in registry with a second capacitor plate 48 such that there will a first capacitor plate and a second capacitor plate associated with each key cell so as to thereby define a unique capacitive key coupling between a first trace 20–34 and a second trace 40–47 for each key 7. Each first trace 20–34 is to have only one first capacitor plate 37 registered with a second capacitor plate 48 connected to a specific second trace 40–47 in order to achieve this capacitive key coupling unique to each key; the lead 39 described above in reference to FIG. 4 is used for this purpose to locate a plate 37 over a plate 48 of a second trace that is somewhat remote from a contact 38 associated with the plate 37.

The first circuit 16 and second circuit 17 as described to this point are functionally the same as in capacitance switch membrane switchcores known in the art for use with keyboards. The following portion of this description now sets forth the unique configuration that represents a first novel aspect of the present invention.

Turning first to FIG. 4, a conductive third circuit 49 is formed along the first or upper surface 18a of dielectric layer 18 that includes a plurality, eight in the exemplary embodiment, of third capacitor plates 50 which are located along the right-hand side of the switchcore 12 as viewed in FIG. 4. Each third capacitor plate 50 is preferably of the same area, although the plates 50 can have different configurations or topographical boundaries and several shapes are depicted in FIG. 4. The specific size and shape of a third capacitor plate 50, as well as its position along the dielectric layer, will depend in large measure upon the space available in a specific capacitance membrane element. Third circuit 49 further includes a plurality of conductive third traces 51, there being a third trace 51 extending from each third capacitor plate 50 along the first surface of the dielectric layer and along tail 36 to edge portion 35.

Referring now to FIG. 5, each second trace 40–47 of second circuit 17 is electrically connected to a fourth capacitor plate 52, there being eight fourth capacitor plates 52 in the second circuit 17 which also are located along the right-hand side of second circuit 17 as shown in the drawing. Second circuit 17 and third circuit 49 are to be electrically aligned with one another along opposite surfaces of dielectric layer 18 such that there will be a fourth capacitor plate 52 of second circuit 17 positioned under a third capacitor plate 50 of third circuit 49. Each fourth capacitor plate 52 is to have the same configuration as its respective third capacitor plate 50, as can be seen with reference to plates 50a and 52a, 50b and 52b. A third capacitor plate 50 and its respective fourth capacitor plate 52 may each have the same area or one can be slightly larger than the other to ensure the plates are aligned when third circuit 49 and second circuit 17 are registered with one another along a dielectric layer.

It is convenient to die-cut dielectric layer 18 and substrate 14 after they have been adhesively laminated together, in which event substrate 14 will have the same shape as dielectric layer 18 and thereby include a tail portion 36'. However, no traces or other conductive leads are formed along tail portion 36', as is the case with some prior art constructions, as they are not necessary in view of the intertrace coupling feature of this invention described next in part (c). Tail portion 36' is thus used solely to provide support for tail 36 of the dielectric layer.

(c) Intertrace Capacitive Coupling, FIGS. 6-9.

A primary objective of this invention is to provide a simple means for providing access to both the drive and sense lines on the same side of the tail 36. This is accomplished in the present invention by the third and fourth capacitor plates 50 and 52, respectively, which capacitively couple the second circuit 17 on the lower surface of dielectric layer 18 back to the third circuit 49 on the upper surface of the dielectric layer. Each pair of third and fourth capacitor plates 50 and 52 defines an intertrace capacitive coupling between a second trace 40-47 of second circuit 17 and a third trace 51 of third circuit 49 which will now be described.

Figure 6:
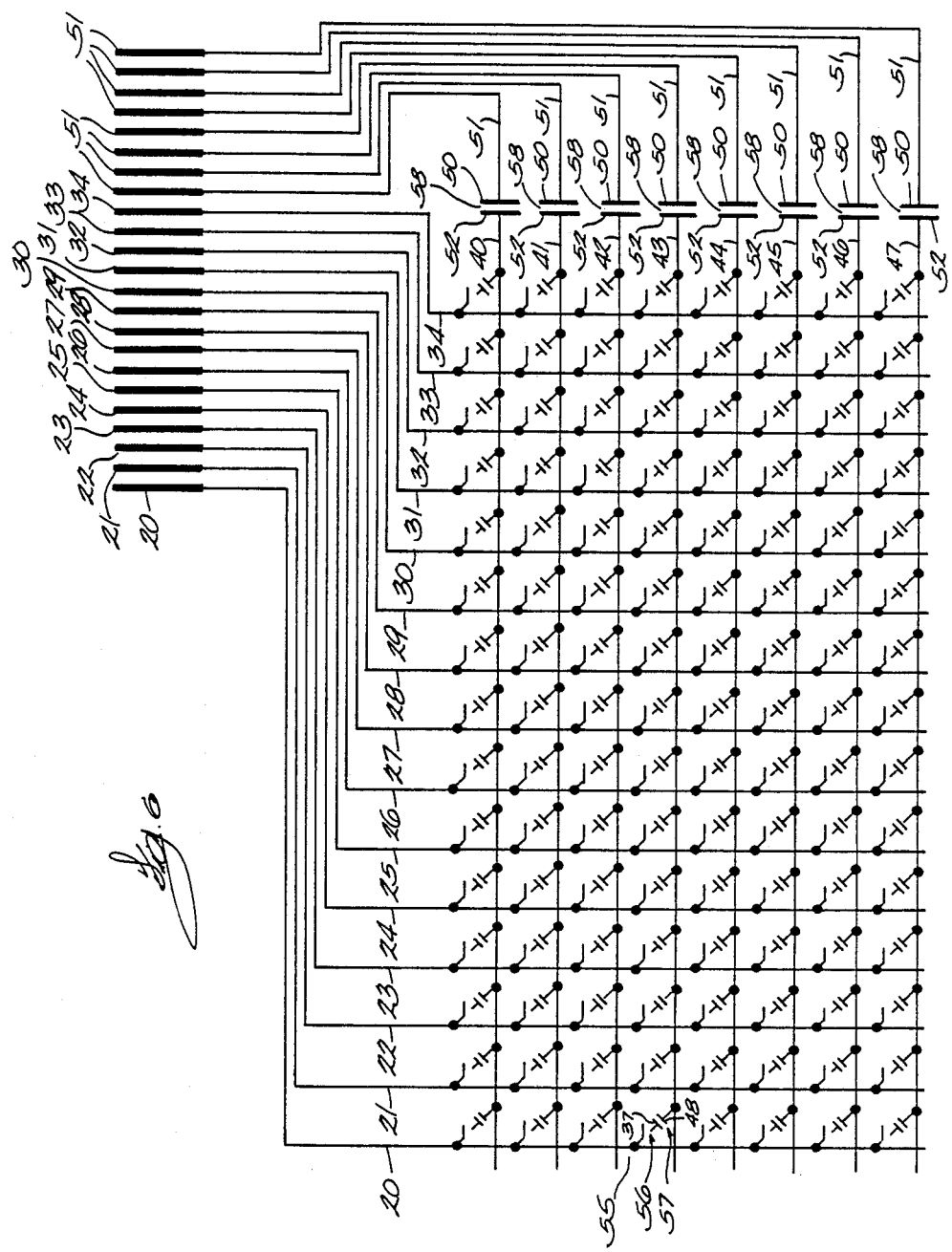
FIG. 6 is an electrical schematic of the switch matrix of the switchcore.

In FIG. 6, the switchcore 12 is represented schematically. The first conductive traces 20-34 are represented as column conductors. The second conductive traces 40-47 are represented as row conductors, intersecting each of the column conductors 20-34 to define a matrix. Each intersection, or crosspoint, defines a key cell, a typical example of which is shown at 55 (see also FIG. 7). Each key cell 55 comprises a normally open switch 56 electrically in series with a fixed capacitor 57. Each series combination of a switch 56 and a capacitor 57 is connected to bridge a unique crosspoint in the matrix.

As shown best in FIGS. 7 and 8, each switch 56 is formed by the pair of contact elements 38a and 38b of a stationary contact 38 disposed underneath a movable contact 10. Each capacitor 57 is formed by one of the first capacitor plates 37 along the upper surface 18a of the dielectric layer 18 registered over one of the second capacitor plates 48 along the bottom surface 18b of the dielectric layer. As noted above, the general structure for a key cell 55 is known in the art. However, an unavoidable consequence of such a key cell structure is that the sensing signal must be coupled across the dielectric layer 18, resulting in traces on both sides of the dielectric. In prior membrane switchcores, various means are provided for accommodating traces on both sides of the dielectric. For example, in IBM Technical Disclosure Bulletin Vol. 24 No. 4, September 1981, page 1886, half of the tail section is folded over to provide access to the traces on the opposite side of the dielectric. Another known construction employs two tails, one for the upper circuit and the other for the lower circuit, with the traces for each circuit extending across its respective tail, thereby requiring two connectors for connection to drive and sense circuits. In other cases, a two sided connector is used to couple both sets of traces to an external circuit. Still other prior membrane switchcores connect traces between layers by providing apertures in the dielectric layer so that the top trace makes physical contact with the bottom trace through the aperture. This latter technique suffers the disadvantage that multiple processing steps and precision alignment are required.

Referring to FIGS. 6-8, a substantial improvement over the prior art is provided by this invention, in that each row conductor, or second trace 40-47, includes a fixed intertrace coupling capacitor 58. Each intertrace coupling capacitor 58 comprises one of the third capacitor plates 50 along the upper surface 18a of dielectric layer 18 registered over one of the fourth capacitor plates 52 along the bottom surface 18b. The intertrace coupling capacitor 58 connected to each second trace 40-47 thereby couples each respective second trace from the bottom surface 18b of dielectric 18 to its upper surface 18a. The third capacitor plate 50 is then connected to one of the third circuit traces 51, which is now on the same upper surface 18a as the first traces 20-34.

FIG. 7 is a simplified schematic to illustrate the nature of intertrace coupling according to my invention. A portion of first circuit 16 is shown in full line, part of second circuit 17 in dashed line, and part of third circuit 49 in full line, bearing in mind that circuits 16 and 49 are along the upper surface of the dielectric layer and second circuit 17 is along the lower surface thereof. First trace 23 and first trace 24 of first circuit 16 each include a stationary contact 38 connected in series with a first capacitor plate 37, which are identified in the drawing as plate 37a of first trace 23 and plate 37b of first trace 24. First capacitor plate 37a of the first circuit is registered with second capacitor plate 48a of second circuit 17, and first capacitor plate 37b of the first circuit is registered with second capacitor plate 48b of the second circuit. Second capacitor plates 48a and 48b are both connected to second trace 47 of the second circuit 17. Trace 47 leads to fourth capacitor plate 52 which also is along the lower surface of the dielectric layer. Plate 52 is in registry with a third capacitor plate 50, which is part of third circuit 49 located along the same surface of the dielectric as first circuit 16. Conductive third trace 51 extends from third capacitor plate 50 across the upper surface of the dielectric to the edge portion 35. First traces 23 and 24 would be connected to either drive or sense circuitry, and third trace 51 would be connected to the other of drive or sense circuitry; both of these connections are made at edge portion 35 and it will be noted that connections for both drive and sense circuitry are made to the same surface of the capacitance membrane element. FIG. 8 is an electrical schematic illustrating this relationship, in which elements of the first and third circuits are shown in full line and elements of the second circuit are shown in dashed line.

It is known in the art that capacitive membrane switchcores are decoded using alternating current (AC) signals. The amount of capacitance at each key cell 55 can thereby be measured by applying an AC drive signal to either the row or column conductors, and sensing the presence or absence of the key cell capacitor 57 at the alternate column or row conductors. In this invention, the intertrace coupling capacitor 58 is interposed in the AC drive/sense signal path. To minimize its effect, therefore, the intertrace coupling capacitors 58 are preferably larger than the individual key cell capacitor 57, usually by a factor of about 5 to 10. A more precise description of the relative sizing for the intertrace coupling capacitors is provided below. Note that since both capacitors 58 and 57 share a common dielectric thickness, their capacitance ratio is equal to ratio of the area of overlap between their respective plates. In other words, the area of overlap between capacitor plates 50 and 52 of a capacitor 58 is preferably about 5 to 10 times larger than the area of overlap between plates 37 and 48 of a capacitor 57. Ratios smaller than 5:1 are still practical and are within the scope of this invention, but are more difficult to decode as the attenuation of the trace coupling capacitor 58 becomes more pronounced.

This invention thereby provides effective coupling for the drive/sense signals between traces of two separate circuits without the disadvantages of prior techniques for doing so. The switchcore 12 of this invention is inexpensively and efficiently formed either by printing the desired patterns with conductive ink on both sides of a dielectric sheet, or by printing the bottom circuit on a substrate, laminating a dielectric film to the substrate, and then printing the upper circuit on top of the dielectric.

Figure 9:
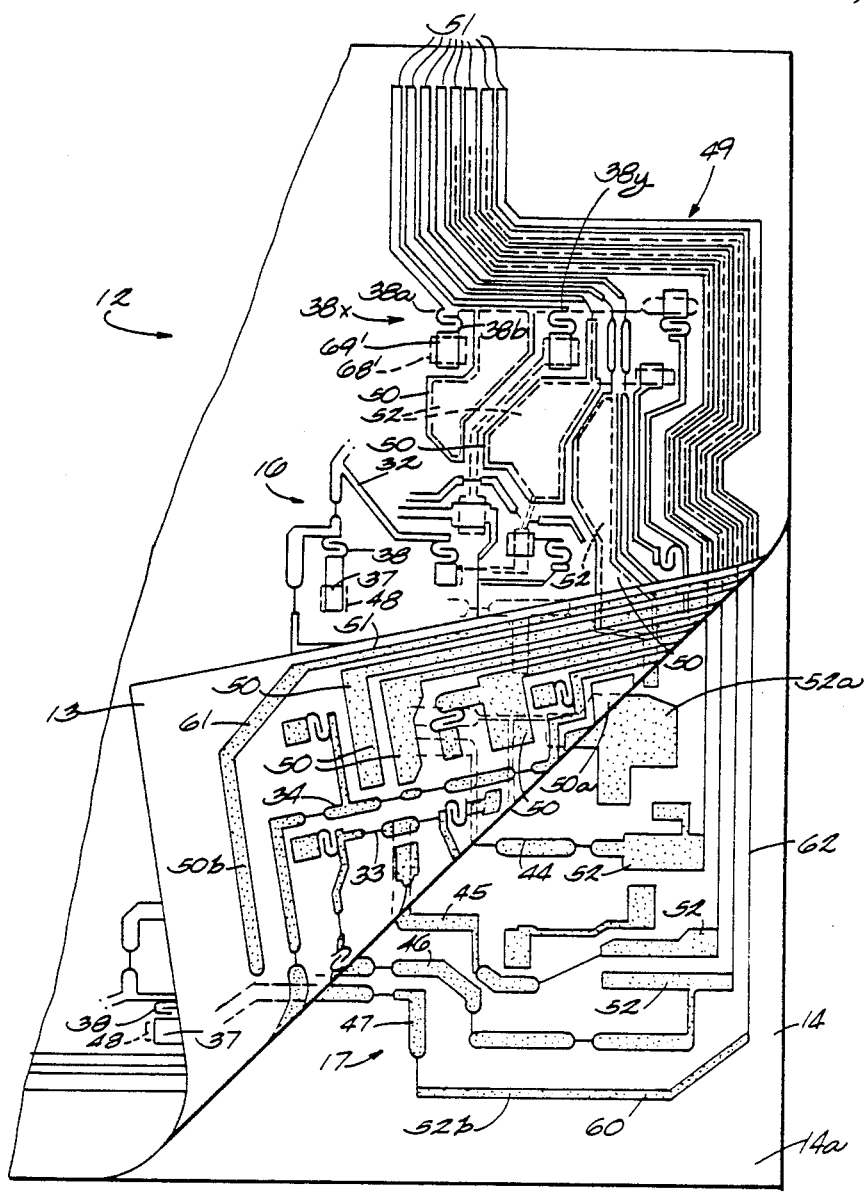
FIG. 9 is a plan view, with a portion broken away and another portion peeled back, of the capacitance membrane switchcore.

FIG. 9 illustrates a portion of switchcore 12 with the dielectric film layer 13 peeled back from the substrate 14, the dielectric film and substrate each comprising a thin flexible plastic film which are adhesively bonded to one another. Film 13 is shown partly peeled back in order to illustrate the manner in which the first and third circuits are arranged in electrical registry with the second circuit 17. In the upper section of the drawing, the first circuit 16 and third circuit 49 are shown in full line, and the second circuit 17 is shown in dashed line to further depict this relationship.

Referring again to FIG. 9, it should be appreciated by those skilled in the art that the intertrace coupling capacitors 58 may be connected anywhere along a second trace 40–47, not necessarily at the end. It should further be apparent that the plates 50 and 52 of an intertrace coupling capacitor 58 may be of any arbitrary shape. For example, plates 50a and 52a form a coupling capacitor with a highly irregular shape, permitting location of the capacitor wherever the available area exists. In fact, the intertrace coupling capacitor may actually comprise any arbitrary area of overlap, not limited to a single pair of plates per se, between the second circuit 17 and the third circuit 49, including multiple areas for plates 50 and 52 electrically connected to their respective traces in parallel, not shown, or highly elongated areas of overlap such as, for example, coextensive trace runs. The latter structure is shown in FIG. 9 by plates 50b and 52b. Plate 52b comprises a main area 60 registered under a corresponding main area 61 of plate 50b. Plate 52b further includes an elongated area 62 registered underneath trace 51 connecting the main area 61 of plate 50b to the tail 36. In that way, the area of overlap between elongated area 62 and trace 51 contributes to the overall capacitance of the intertrace coupling capacitor 58 thereby formed.

Figure 10:
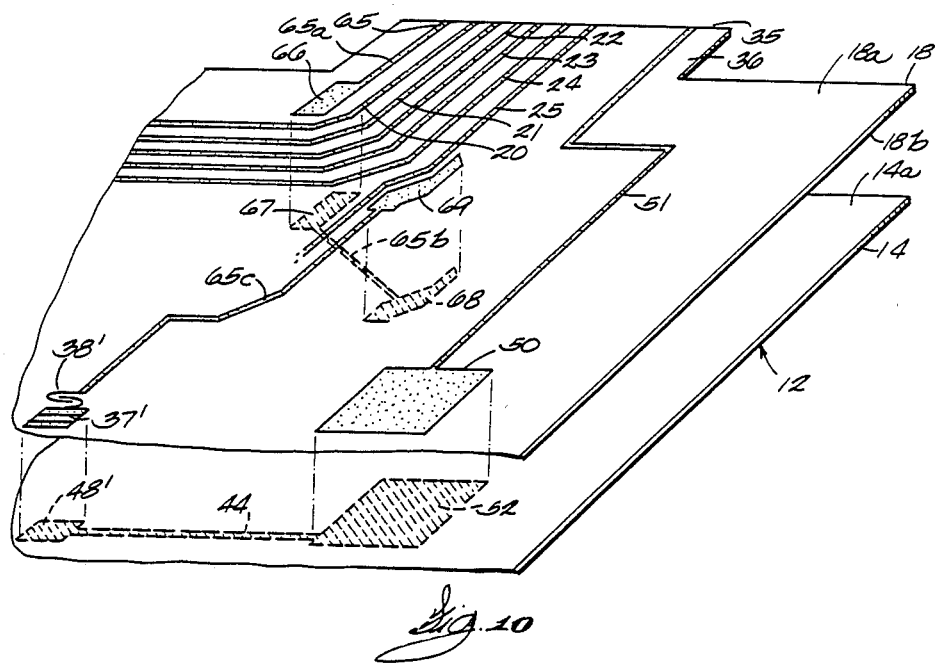
FIG. 10 is a schematic diagram of the intratrace coupling feature of the present invention.

(d) Intratrace Capacitive Coupling, FIGS. 4, 5 and 10.

Another aspect of the invention relates to the feature referred to herein as intratrace capacitive coupling, according to which a trace can have branches along both the upper surface and lower surface of the dielectric layer. This provides the designer with an especially useful technique for routing a trace along a dielectric layer without interfering with other traces, which often presents a difficult problem in view of space and architectural limitations imposed by the requirements of the end user of a capacitance membrane element.

Turning first to FIG. 4, first circuit 16 includes an additional conductive first trace 65, and it is desired to extend trace 65 across traces 20–29 of the first circuit in order to reach a specific location along the membrane element, but it would be functionally impossible to have trace 65 superposed on top of these traces since this would result in short circuiting of various elements. The intratrace capacitive coupling feature serves to avoid this disability. Trace 65 has a first branch 65a extending from edge portion 35 along upper surface 18a of dielectric layer 18 to first upper intratrace capacitor plate 66 which also is located along surface 18a.

Turning next to FIG. 5, first lower intratrace capacitor plate 67 is formed along upper surface 14a of substrate 14 and is electrically in registry with plate 66. Plate 67 is positioned along the lower surface 18b of the dielectric layer 18. A lower second branch 65b of trace 65 extends along the lower surface of the dielectric layer from plate 67 to second lower intratrace capacitor plate 68 that is located a selected distance from plate 67.

Returning to FIG. 4, second upper intratrace capacitor plate 69 is formed along upper surface 18a of the dielectric layer and is electrically in registry with second lower intratrace capacitor plate 68. Trace 65 further includes an upper third branch 65c that extends from plate 69 along upper surface 18a of the dielectric to stationary contact 38″. A key cell first capacitor plate 37″ is connected in series to contact 38″. Turning to FIG. 5, second capacitor plate 48″ is located under plate 37″ so as to thereby form a key cell fixed capacitor 57 as previously described. Second capacitor plate 48″ is connected to trace 44 of the second circuit 17 which leads to a fourth capacitor plate 52 that is an element of the intertrace capacitive coupling for second trace 44.

From the foregoing description, it can now be seen that first trace 65 of first circuit 16 has a first branch 65a along the upper surface 18a of the dielectric layer which is capacitively coupled to a second branch 65b along the bottom surface of the dielectric layer by means of the fixed intratrace coupling capacitor formed by plates 66 and 67, and a third branch 65c along the upper surface of the dielectric layer that is coupled to the second branch via the fixed intratrace coupling capacitor formed by plates 68 and 69. This construction enables trace 65 to extend under first traces 20–29 of the first circuit by means of the intratrace coupling of plates 66 and 67 to its branch 65b along the bottom surface and then return to the upper surface 18a by means of the intratrace coupling of plates 68 and 69 so as to thereby lead to a key cell stationary contact 38 that is along the upper surface of the dielectric. FIG. 10 is a schematic representation of this bi-level construction of trace 65. The drawing is a simplified representation and includes only six of the first traces, traces 20–25, for clarity of illustration.

Other configurations using intratrace coupling capacitors are possible to aid designers in routing traces. As shown in FIGS. 4 and 5, contact 38x is connected to first trace 32 by two intratrace coupling capacitors formed by plates 66′ & 67′ and plates 68′ & 69′. Contact 38x, see FIG. 9, has its contact element 38b connected directly to plate 69′, and its contact element 38a connected directly to a third trace 51. The intratrace coupling capacitors are sized to serve as the key cell capacitor for contact 38x. Contacts 38y and 38z have a configuration similar to that of contact 38x, wherein contact 38y is connected to first trace 33 with a pair of intratrace coupling capacitors and contact 38z is connected to first trace 21 with a pair of intratrace coupling capacitors.

It can be seen that each key cell contact in switchcore 12 is served by an even number of capacitors which may include a key cell capacitor, an intertrace coupling trace capacitor and/or intratrace coupling capacitors. A key cell contact can precede or follow the capacitors with which it is served or be positioned between any pair of such capacitors.

From the above description, it should be apparent that in a branch where intratrace coupling capacitors are used, the effective key cell capacitance is determined by the series connection of several capacitors; e.g. the key cell capacitance itself and the two intratrace coupling capacitances formed by the plate pairs 66, 67 and 68, 69, respectively. As will be described below, it is desired to maintain parity between all of the effective key cell capacitances. When intratrace coupling is used, the effective key cell capacitance can be made to approximate that of other key cells in two different ways. First, if sufficient area is available, the intratrace coupling capacitors can be made much larger than the key cell capacitors so that their effect is negligible. However, this approach is not always practical as it requires additional area which is usually scarce. A second and more practical approach is to size each of the capacitors in the branch series such that the series capacitance is equal to the desired value of key cell capacitance. For example, with three capacitors in the branch series (one key cell capacitor and two intratrace coupling capacitors) each capacitor may be sized to produce a value three times larger than the desired value of key cell capacitance. The effective capacitance for the series is then one third of the individual capacitances, which is the desired value. Note that in this example, the key cell capacitor, and therefore its area, is three times larger than a key cell which does not employ intratrace coupling, and the same size as the two intratrace coupling capacitors. As will be described below, specific structures are used for the key cell capacitors to insure the accuracy of their values and to prevent variation of those values should a misalignment occur between the respective plates. As has just been described, the intratrace coupling capacitors participate in determining the value of effective key cell capacitance and so are preferably formed using the same techniques and structures described below for key cell capacitors.

(e) FIGS. 11–15.

The physical layout of a key cell 55 can assume many forms, several of which are illustrated in FIGS. 11–15 as exemplary preferred embodiments. In the description below, it will be apparent that since each key cell capacitor 57 has a relatively small value of capacitance, it is important to provide a fairly precise value for the key cell capacitor 57 which is tolerant to slight misalignments between circuits. Elements of first circuit 16 are shown in solid line and elements of second circuit 17 in dashed line in FIGS. 11–15.

Referring to FIGS. 11 and 12, the stationary contact 38 is "S" shaped, with the contact elements 38a and 38b being interdigitated near the center. In FIG. 11, the first and second capacitor plates which comprise the key cell capacitor 57 are rectangular overlapping plates 75 and 76. The rectangular plates 75 and 76 are oriented with their longer sides orthogonal, forming a cross. In that way, if the plates 75 and 76 are slightly laterally misaligned, the area of overlap, and thus the capacitance, remains constant. Similarly in FIG. 12, the first plate 77 is rectangular and is registered above a broad conductor 78. Conductor 78 may be, for example, part of a trace which is widened to also serve as a capacitor plate. The width of conductor 78 is greater than the corresponding dimension of first plate 77. The lead 39 connects first plate 77 to contact 38b, and the first plate 77 further includes a projecting finger 80 opposite the lead 39. The purpose of projecting finger 80 is again to neutralize any capacitance change caused by misalignment. The key cell capacitor 57 in FIG. 12 is comprised by the net area of conductors overlying the broad lower conductor 78, including a portion of the lead 39, the entire area of first plate 77, and a portion of the area of projecting finger 80. If the projecting finger 80 were not included, then a lateral misalignment along the axis of the lead 39 would result in more or less of the lead covering the lower conductor 78, and a corresponding change in capacitance. The projecting finger 80 is formed with the same width as the lead 39, and so compensates for such lateral misalignment, keeping the area of overlap, and thereby the key cell capacitance 57, constant.

Referring to FIG. 13, in another embodiment of a key cell 55, the stationary contact 38 is formed by interdigitated spirals 38a and 38b. Spiral 38b is formed integrally with first capacitor plate 81, and so is useful, for example, if the key cell capacitor is desired to be physically located at the key site, as opposed to remotely from the key site as in other embodiments described herein. In this case, the capacitor plate 81 is generally rectangular, except for a circular cutout portion near one corner of the rectangle to accommodate the contact 38. This structure is advantageous in that the combination of the capacitor plate 81 and the contact 38 is compact, defining the rectangular area, and further that the contact 38 may be placed at any corner of the rectangle, facilitating trace layout. Opposing the first capacitor plate on the other side of dielectric layer 18 is second capacitor plate 82. Second capacitor plate 82 includes a main portion 82a which is generally smaller than first capacitor plate 81 in all dimensions, including the circular cutout portion. Second capacitor plate 82 further includes a series of projecting tabs 82b extending from the main portion 82a of capacitor plate 82, out to a position outside the boundary defined by the overlaying first capacitor plate 81. Two projecting tabs 82b are included on each of the four principal sides of main portion 82a, so that in case of lateral misalignment, any area uncovered by two of the tabs 82b will be picked up by the other symmetrically placed tabs 82b. In addition, the tabs 82b provide convenient connection points, accessible from all sides of the key cell, for attaching to traces 83. In that way, the traces 83 do not have to be routed under first capacitor plate 81 to the main portion 82a, which would otherwise produce a change in capacitance.

In FIGS. 14 and 15, yet another embodiment for a key cell 55 comprises an S-shaped stationary contact 38, similar to that described in relation to FIGS. 11 and 12 and positioned in abutting relation between a first trace 85 and a first capacitor plate 86. First capacitor plate 86 is approximately square, and contains a hollow, or cutout, central rectangular portion 89. A second trace 87 on the opposite side of the dielectric layer 18 widens out to a broad conductive area 87b, a portion of which lies under first capacitor plate 86. It is preferred that the trace 87 be narrow in portions 87a where traces along opposite surfaces of the dielectric layer cross so as to minimize stray capacitance, and to be widened elsewhere, for example at 87b, to reduce trace resistance and to serve in part as the second capacitive plate. For example, in FIG. 15, the broad conductive area 87b is relatively long, and serves as the second capacitor plates for two different key cells 55a and 55b. The key cell capacitance 57 is thereby defined by the area of first capacitor plate 86, excluding the central rectangular cutout 89, which overlaps the broadened conductive area 87b. The function of the central rectangular cutout 89 is to provide for fine adjustment of the key cell capacitance 57 during key cell layout and design, without the need to reshape or reposition the basic outline of the first capacitor plate 86. The key cell capacitance value can thereby be adjusted, or trimmed, by simply changing the area of the central rectangular cutout 89. Further, the central rectangular cutout 89 is narrower than the broad conductor 87b below, so that if the first capacitor plate 86 is misaligned, the central rectangular cutout 89 will remain completely over the broad conductor 87b and there will be no net change in capacitance. As an additional alternative, key cell 55a as shown in FIG. 15 may include lead 39 connected between stationary contact 38 and the capacitor plate 86, instead of abutting the capacitor plate 86 to the stationary contacts as in key cell 55b.

(f) Intertrace Capacitive Coupling, FIGS. 16–19

As described above, intertrace coupling capacitors are used to couple two traces through the dielectric 18, wherein at least one of the traces includes connections to multiple key cells. Therefore, the main requirement for an intertrace coupling capacitor is that it have a large capacitance so that the attenuation of the sense signal by the intertrace coupling capacitor is minimal. Unlike the key cell capacitors described above, the capacitance value of the intertrace coupling capacitor does not necessarily need to be accurate to a precise value or invariant under misalignment. The relative size of the intertrace coupling capacitor, as compared to the individual key cell capacitors, may vary depending on the application and the decoding method used. For example, the intertrace coupling capacitor may be placed in either a drive line or a sense line, depending on how the switchcore is connected to the external decoding circuitry. If the intertrace coupling capacitor is in a drive line, then it is preferably sized according to both the number of key cells connected along that drive line and the size of each individual key cell capacitor. This is because the intertrace coupling capacitor should be large enough so that if multiple keys along the drive line are actuated, or all of the keys in that line are actuated in the worst case, then the degradation, or attenuation, caused by the additional loading of the multiple closures does not cause excessive signal loss across the intertrace coupling capacitor. In particular, it has been determined that a practical size for the intertrace coupling capacitor may be determined according to the formula:

$$C_{ICC} = 1.33 \text{ times } N_{DRIVEN} \text{ times } C_{KEY\ CELL} \quad (1)$$

Where:

$C_{ICC}$ = Capacitance value for intertrace coupling capacitor;

$N_{DRIVEN}$ = Number of key cells connected to the drive line served by the intertrace coupling capacitor; and $C_{KEY\ CELL}$ = Capacitance value of each individual key cell.

Alternatively, if the intertrace coupling capacitor is placed in a sense line, then it is preferably sized according to the load impedance presented by the decoding circuitry. As is known in the art, the load impedance of the decoding circuitry is usually resistive or capacitive, and the intertrace coupling capacitor should be sized so that appreciable signal loss is avoided. This is usually easily accomplished because the load impedances can be selected to be relatively high values.

An intertrace coupling capacitor may be implemented in a variety of geometries, as illustrated in the exemplary embodiments of FIGS. 16–18. Elements of first circuit 16 are shown in full line in FIGS. 16–18 and elements of second circuit 17 in dashed line. In FIG. 16, the intertrace coupling capacitor 58 comprises a lumped capacitance, formed by upper plate 95 registered over lower plate 96. A typical key cell 55 and key cell capacitor 57 are also shown in FIG. 16 for comparative purposes, illustrating the relatively greater area taken up by intertrace coupling capacitor plates 95 and 96. Note also that the topological boundaries of the plate 95 and 96 are highly irregular. Since a relatively large area is required, it is not always available in regularly shaped chunks. The area for the intertrace coupling capacitors must therefore be taken from wherever it is available, between trace runs, around key cell positions, etc. As a result, all of the intertrace coupling capacitors on a switchcore may be irregularly shaped and have entirely different shapes from each other. In fact, an intertrace coupling capacitor may even comprise multiple plates in disjoint areas, electrically connected in parallel. Again, the only requirement for the intertrace coupling capacitors is that their capacitance values, and therefore their net area, be large. The ability to allocate that area wherever it is available is a particular advantage of this invention.

For example, the intertrace coupling capacitor 58 of FIG. 17 comprises an area of lumped capacitance 97a, and an area of distributed capacitance 97b. The area of lumped capacitance 97a is formed by plates 98 and 99 in registration with each other. If sufficient area is not available for the plates 98 and 99 to provide all the capacitance required for intertrace coupling, as is assumed in this example, then additional capacitance may be obtained by extending a trace 100 from one of the plates, for example plate 99, coextensively with the trace 101 connecting to the other plate 98. In that way, the capacitance between the traces 100 and 101, which is normally parasitic, is in this case used for positive benefit to augment the capacitance from plates 98 and 99. The total capacitance of the intertrace coupling capacitor 58 of FIG. 17 is therefore determined by the combined area of overlap between plates 98 and 99, and between coextensive traces 100 and 101. The use of coextensive or superposed traces to produce a desired capacitance is most useful where sufficient area is not available for lumped capacitor plates, but a relatively long trace run is available on both sides of the dielectric 18. In the extreme, as shown in FIG. 18, an area may not be available at all for lumped capacitor plates, and the entire intertrace coupling capacitor 58 may comprise coextensive trace runs 102 and 103.

Referring to FIG. 19, the coextensive trace runs, as described above, not only provide supplemental capacitance, but in addition actually serve to reduce the effective impedance of either single trace run alone to higher frequency components in the sense signal. Since each of the coextensive traces carries part of the AC signal components, the impedance of the coextensive trace run pair is less than either trace alone would be. This effect, of lowering trace impedance by the use of coextensive trace runs can be used even if capacitive coupling between trace layers is not necessary. For example, in FIG. 19, a trace 105 runs uninterrupted entirely on one surface of the dielectric 18. If trace 105 cannot be widened due to space constraints, and if space is available opposite trace 105, then a coextensive trace run 106 may be placed on the opposite side of the dielectric 18 running parallel with trace 105. If trace 105 is printed with an ink having a relatively high resistivity, for example carbon based ink, then there will be some voltage drop along the length of trace 105. High frequency signals passing along trace 105 will capacitively couple mutually between coextensive traces 105 and 106, such that part of the high frequency currents will be carried by trace 106, thereby lowering the overall impedance.

(g) Additional Embodiments, FIGS. 20–27

Capacitance membrane switchcore element 12 described above is a three layer construction comprising dielectric film layer 13 laminated to substrate film 14 along adhesive layer 15, and wherein film layer 13 and adhesive layer 15 define a dielectric layer 18. This construction provides a switchcore that can be manufactured with a reduced number of processing steps. Thus, for example, (1) second circuit 17 is screen printed onto substrate 14, (2) adhesive layer 15 is applied over the entire surface of substrate 14 so as to also cover second circuit 17, (3) dielectric film 13 is laminated to the adhesive layer, and (4) first circuit 16 is screen printed onto the exposed surface of dielectric film layer 13. As an alternative to step (2), adhesive layer 15 can be applied to the bottom surface of film layer 13, following which the dielectric film is laminated to the substrate and upper circuit 16 is printed onto the dielectric film.

The switchcore 12 can also be formed as a single layer construction, which is illustrated in FIG. 20 and identified as switchcore 12a. In this embodiment, the dielectric layer 18 consists of only the thin film layer 13. Second circuit 17, including second capacitor plates 48, second traces 40–47 and fourth capacitor plates 52, is screen printed along bottom surface 18b of the dielectric layer, which is the bottom surface of the film 13; and first circuit 16 is screen printed along the upper surface 18a of the dielectric layer, which is the upper surface of film 13, including stationary contacts 38, first capacitor plates 37 and first traces 20–34. Also, third circuit 49, including its third capacitor plates 50 and third traces 51, is screen printed along upper surface 18a of the dielectric layer simultaneously with printing of first circuit 16. This construction provides a capacitance membrane switchcore that can be manufactured in a minimum number of process steps, thereby leading to a further reduction in costs. Switchcore 12a can be used in a keyboard, for example, with the second circuit along the base 3 of the housing illustrated in FIGS. 1 and 2. Also, however, a nonconductive coating can be screen printed over second circuit 17 for additional protection if necessary in a specific application of switchcore 12a. In general, film layer 13 of switchcore 12a would have to be somewhat thicker than layer 13 of switchcore 12 so as to be able to withstand the printing steps without physical damage which has the further effect of nominally reducing the capacitance of the various capacitors in the several circuits; however, the capacitors can still be made with capacitance values that can be appropriately decoded.

Capacitance membrane switchcores 12 and 12a as described to this point can be characterized as the "open" type of switchcore wherein the upper circuit 16 is exposed to the environment. Both constructions also can be made as a "closed" type of switchcore such as illustrated in FIG. 21, which shows switchcore 12a embodied in a closed construction. A spacer layer 110 is positioned between the upper surface of element 12a and a top layer 111 of flexible plastic film. The spacer layer 110 may comprise a thin sheet of plastic film that is diecut with apertures 112 positioned over each stationary contact 38 of the first circuit 16, there thus being an aperture 112 at each key of the array. When spacer layer 110 is made from plastic film, it will be adhesively laminated to both the upper surface of switchcore 12a and the bottom surface of top layer 111. Also, however, spacer layer 110 may be a layer of adhesive screen printed in a pattern that defines the apertures 112. The movable contacts 10 are applied along the bottom surface of top layer 111, i.e. the surface thereof facing switchcore 12a, and arranged such that there is a contact 10 located within each aperture 112 of the spacer layer. When a key 7, depicted schematically in FIG. 21, is actuated, it is pressed downward so as to contact top layer 111 and deflect the layer sufficiently to bring contact 10 into electrical contact with stationary contact 38. The closed construction illustrated in FIG. 21 can also include capacitance membrane switchcore 12 as previously described. The closed construction is useful in instances in which maximum environmental protection of the switchcore is required, or when a flexible film top layer 111 is desired for a particular keyboard.

Another embodiment of a closed type of capacitance membrane switchcore according to this invention is illustrated in FIGS. 22 and 23, identified as switchcore 12b comprising upper film 120 and lower film 121 separated by dielectric layer 122. The dielectric layer 122 can be a layer of nonconductive adhesive joining films 120 and 121 together or a plastic film adhesively laminated to films 120 and 121. Dielectric layer 122 also acts as a spacer layer and includes an aperture 123 at each key cell of the switchcore; one key cell is illustrated in FIGS. 22 and 23, it being understood switchcore 12b includes a plurality of key cells. The upper film 120 is sufficiently flexible to be deflected downward at each aperture 123 by pressure from a key actuating mechanism, or simply an operator's finger. Upper film 120 may include a dome 124, shown in dashed line in FIG. 23, at each key cell to provide a snap action or tactile feel upon actuation.

Switchcore 12b includes a conductive first circuit 16' formed along the top surface 121a of lower film 121 that comprises a plurality of conductive first traces 130 and a plurality of first capacitor plates 131 electrically connected to each first trace. First traces 130 are arranged in generally row form along the switchcore. Circuit 16' further includes a plurality of additional first capacitor plates 132 which are not electrically connected to the first traces of 130 of the circuit; each additional first capacitor plate 132, however, is electrically connected to a lower contact 133 of the first circuit 16' by a conductive lead 134. There is to be a first capacitor plate 131, additional first capacitor plate 132 and lower contact 133 at each key cell of the switchcore 12b, only one of which is illustrated in FIGS. 22 and 23, arranged with the contact 133 within an aperture 123 and plates 131 and 132 adjacent an aperture 123. First circuit 16' of switchcore 12b is analogous to first circuit 16 of the switchcores described above, but it is located along the lower surface of the dielectric layer of the switchcore.

Switchcore 12b further includes a second circuit 17' defined along the bottom surface 120a of upper film 120 that includes a plurality of second traces 135, one of which is shown in FIGS. 22 and 23, a plurality of upper contacts 136 electrically connected to each second trace 135 and a plurality of second capacitor plates 137. A contact 136 is located within each aperture 123 and a plate 137 is adjacent each aperture 123. Second traces 135 of circuit 17' are arranged in generally column form along the switchcore. There is an upper contact 136 and a second capacitor plate 137 at each key cell of the matrix. The second capacitor plates 137 are independent of and not electrically connected to second traces 135 or upper contacts 136 of second circuit 17'. Second capacitor plates 137 are thereby floating in an electrical sense with respect to other conductive elements of the second circuit. Each second capacitor plate 137 at a key cell is registered with a first capacitor plate 131 and additional first capacitor plate 132 of circuit 16' at each key cell to thereby form a first key cell fixed capacitor $C_1$ with respect to a first capacitor plate 131 and a second key cell fixed capacitor $C_2$ with respect to an additional first capacitor plate 132. The net key cell capacitance is then equal to the series combination of capacitances $C_1$ and $C_2$, plus a small mutual stray capacitance between plates 131 and 132. Each second trace 135 is connected to at least one fourth capacitor plate 52'. Second circuit 17' of switchcore 12b is analogous to second circuit 17 of the embodiments previously described, but it is located along the upper surface of the dielectric layer of the switchcore.

Switchcore 12b also includes third circuit 49' defined along top surface 121a of lower film 121. Third circuit 49' comprises a plurality of third capacitor plates 50' and a third trace 51' leading from each capacitor plate 50' to an edge of the switchcore. There is to be one third capacitor plate 50' in the third circuit for each fourth capacitor plate 52' of the second circuit 17' and in registry therewith to thereby form an intertrace coupling capacitor 58'. Use of an intertrace coupling capacitor 58' in this type of switchcore is advantageously applied to couple third traces 51' to second traces 135 through the dielectric layer 124, whereby first traces 130 and third traces 51' can extend to an edge of the switchcore for connection to electronic drive and sense circuitry of the keyboard with which the switchcore is combined and both are located on the same surface of the switchcore to thereby greatly simplify connection to the external circuitry.

Operation of the switchcore 12b will now be described assuming the drive circuitry of a keyboard is connected to the first traces 130 of the matrix and sense circuitry of the keyboard is connected to third traces 51' of the matrix. When a particular key cell is activated, such as by depressing a key, so as to bring upper contact 136 into contact with a lower contact 133, a drive signal from the drive circuitry passes through the fixed capacitor $C_1$ defined by a first capacitor plate 131 and second capacitor plate 137, next through the fixed capacitor $C_2$ formed by second capacitor plate 137 and additional first capacitor plate 132, then through the switch defined by lower contact 133 and upper contact 136 thence through a second trace 135 which is coupled through intertrace coupling capacitor 58' so that the signal exits the switchcore along a third trace 51' for detection by the sense circuitry of the keyboard.

The various conductive traces, capacitor plates and contacts described herein in connection with switchcore 12b preferably are formed by first printing the appropriate circuits on films 120 and 121 with conductive ink, and then laminating the films together with a patterned adhesive layer to form dielectric layer 124 of the construction. This method is superior to the known prior method of printing capacitor plates directly on an adhesive layer as it avoids wide variation in capacitance values and/or breakdown or shorting of the capacitors so formed. Switchcore 12b also can be made by laminating printed films 120 and 121 with a diecut plastic film having adhesive on both surfaces to form the dielectric layer.

Figure 26A:
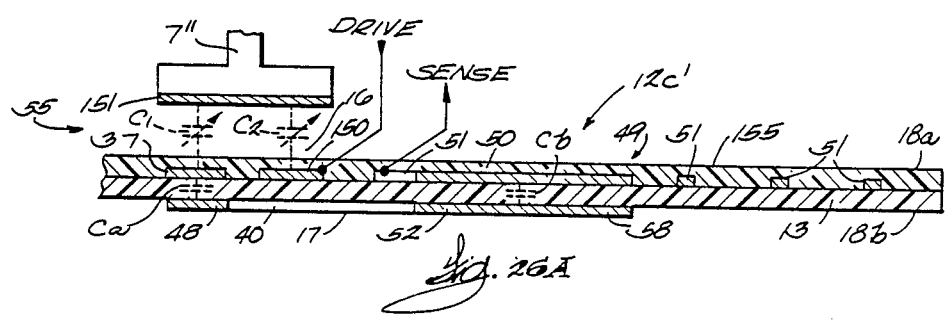
FIG. 26 is a sectional view of the switchcore illustrated in FIGS. 24 and 25.
Figure 24:
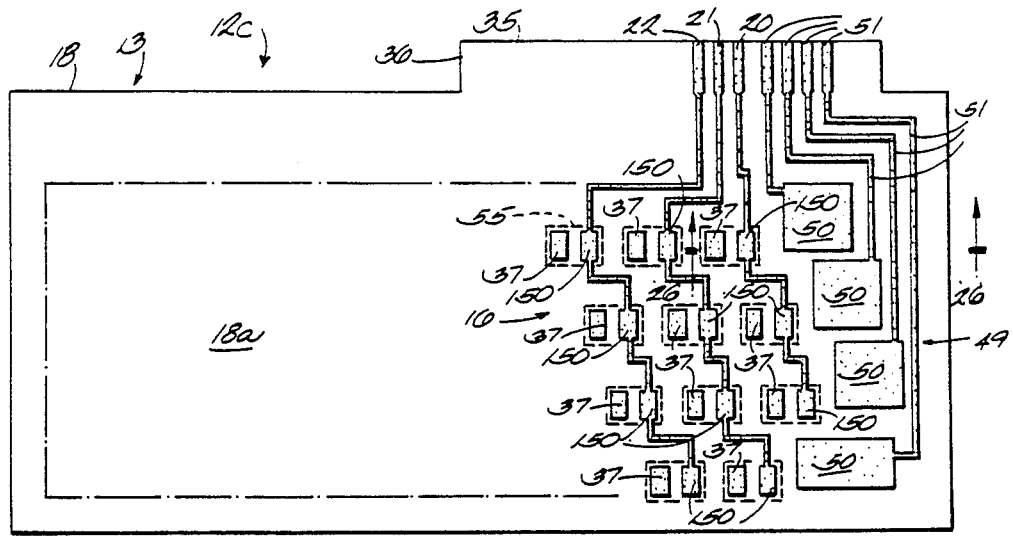
FIG. 24 is a plan view of a fourth embodiment of a capacitance membrane switchcore incorporating the present invention illustrating the conductive circuitry along one surface of the dielectric layer.
Figure 25:
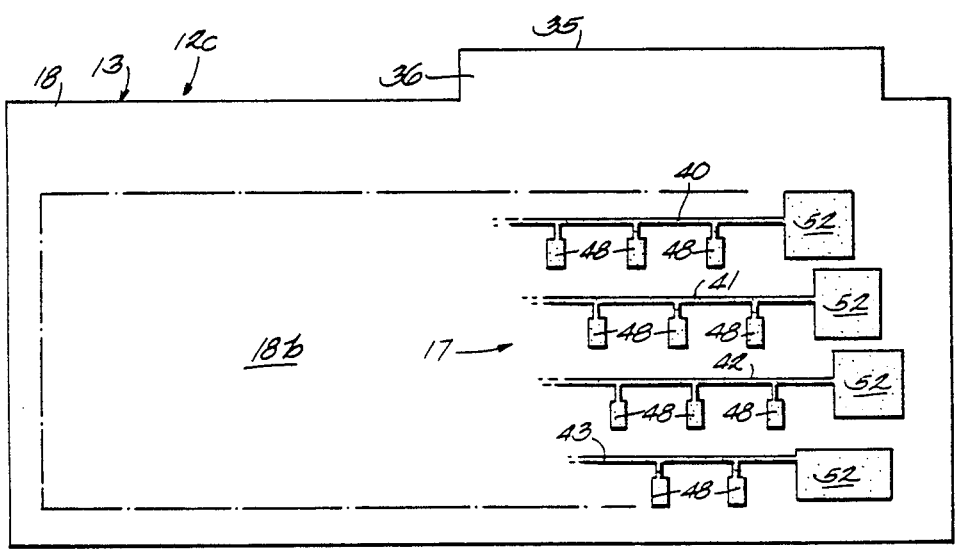
FIG. 25 is a plan view illustrating the conductive circuitry along the surface of the dielectric layer of the fourth embodiment opposite from that of FIG. 24.
Figure 26:
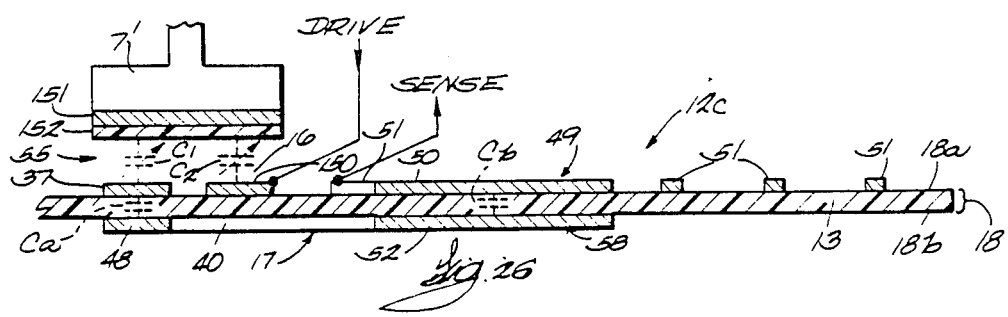

FIGS. 24–26 illustrate a capacitance membrane switchcore 12c incorporating intertrace capacitance coupling of the present invention in a moving plate type of capacitance switchcore. Switchcore 12c includes a thin dielectric film layer 13 with the respective circuits of the switchcore applied along the upper surface (FIG. 24) and the lower surface (FIG. 25) thereof. Thus, the dielectric layer 18 of switchcore 12c consists of only the film layer 13. Considering FIG. 24 first, first circuit 16 is defined along upper surface 18a of the dielectric layer and includes a plurality of first traces, first traces 20–22 being shown, it being understood that other first traces may be included in the matrix. Each first trace 20–22 extends in a generally column arrangement along first surface 18a of the dielectric layer. Further, a plurality of key cell capacitor driven plates 150 are connected in series to each trace 20–22. There is to be one driven plate 150 defined along surface 18a at each key cell 55 to be included in the matrix. Driven plates 150 are illustrated as rectangular in form in FIG. 24, but can be of other configurations. The first traces extend to an edge 35 of the dielectric layer, which may be defined to form a tail 36, for connection to defined along upper surface 18a of the dielectric layer alongside each driven plate 150; however, the first capacitor plates 37 are independent of and not electrically connected to driven plates 150 or the first traces 20–22. Each key cell 55 of the matrix defined by the switchcore 12c thus includes a driven plate 150 and a first capacitor plate 37 at each site.

Referring still to FIG. 24, third circuit 49 is also defined along upper surface 18a of the dielectric layer and comprises a plurality of third capacitor plates 50 and a third trace 51 extending from each capacitor plate 50 along first surface 18a of the dielectric layer and tail 36 to edge portion 35, also for connection to external circuitry as with first traces 20–22.

The second surface 18b, or bottom surface, of the dielectric layer of switchcore 12c is illustrated in FIG. 25. The second circuit 17 is defined along second surface 18b and includes a plurality of second traces, of which second traces 40–43 are shown, it being understood that additional second traces may be included in second circuit 17. A plurality of second capacitor plates 48 are electrically connected to each conductive second trace 40–43. There is to be one second capacitor plate 48 at each key cell 55 of the matrix defined by switchcore 12c. As shown in the drawing, the second traces 40–43 are arranged in generally row form across the dielectric layer 18. A fourth capacitor plate 52 is electrically connected to each second trace 40–43, respectively.

FIG. 26 is a sectional view through a typical key cell 55, illustrated in connection with a key cell associated with first trace 20 and second trace 40, to illustrate the relationship between the various circuits of the switchcore 12c. The first circuit 16 and second circuit 17 are arranged relative to one another along first surface 18a and second surface 18b, respectively, of the dielectric layer 18 in such fashion that a first capacitor plate 37 is electrically aligned with a second capacitor plate 48 at each key cell 55. A driven plate 150 of the first circuit is also located at each key cell 55. Second trace 40 leads to fourth capacitor plate 52 which is located along second surface 18b and is electrically aligned with third capacitor plate 50 located along upper surface 18a. In this exemplary embodiment, drive circuitry associated with a key board is connected to a first trace 20 which leads to a driven plate 150. Also, sense circuitry of the key board is connected to a conductive third trace 51 which leads to a third capacitor plate 50. The first capacitor plate 37 and second capacitor plate 48 define a fixed capacitor $C_a$ at each key cell. The third capacitor plate 50 and fourth capacitor plate 52 define an intertrace coupling capacitor 58 which couples second circuit 17 to the third circuit 49, the intertrace coupling capacitor being further identified by the symbol $C_b$.

Still referring to FIG. 26, switchcore 12c is designed to be combined with a key such as key 7' including a conductive movable capacitor plate 151 at its distal end that is covered with a dielectric layer 152, which may be a coating or a thin sheet of plastic film. Plate 151 at the end of key 7' and the dielectric layer 152 define a variable capacitor $C_1$ with first capacitor plate 37 and a variable capacitor $C_2$ with driven plate 150 at each key cell 55. Key 7', when actuated, is pushed downwards so that dielectric layer 152 contacts plates 37 and 150 to change variable capacitors $C_1$ and $C_2$ from low to high capacitance and thereby generate a detectable signal across fixed capacitor $C_a$ defined by first and second plates 37 and 48, respectively, as in the switchcore embodiments described above. Further, a signal generated at a key cell at fixed capacitor $C_a$ is transmitted along second trace 40 and across intertrace coupling capacitor 58 and thence to third trace 51. It will be noted that the intertrace coupling capacitor 58 according to my invention enables the switchcore 12c, as with switchcores described above, to be connected to drive and sense circuitry along only one surface of the switchcore, 18a in the exemplary embodiment.

FIG. 26a is a partial sectional view along the same section line as FIG. 26 that illustrates an alternate manner in which switchcore 12c may be incorporated in a movable plate type of switchcore. In this embodiment, upper dielectric film layer 155 is joined to switchcore 12c so as to completely cover the first circuit 16 and third circuit 49 and thereby form switchcore 12c'. Thus, as indicated in FIG. 26a, upper dielectric film 155 covers the first surface 18a of dielectric layer 18, which consists of film 13 of the switchcore. Key 7" carries movable capacitor plate 151 at its distal end as with key 7' of FIG. 26, but the plate 151 is exposed and is not covered with a dielectric layer in FIG. 26a. Dielectric layer 155 is a continuous layer of the construction and performs the same function for all of the keys in the construction as was the case with a dielectric layer 152 at each individual key 7' of FIG. 26. The operation of switchcore 12c' upon acutation of a key 7" is the same as described above in connection with switchcore 12c.

It should be noted at this point that switchcores 12c and 12c', although illustrated as including single layer constructions similar to switchcore 12a, may also comprise a laminated construction including a thin film layer 13, adhesive layer 15 and film substrate 14 laminated to film 13 by the adhesive layer, which is the same type of construction illustrated previously with respect to switchcore 12. Thus, the two layer construction of switchcore 12 may also be incorporated in a switchcore designed for use with a moving plate array. Switchcores 12c and 12c' are exemplary forms of moving plate capacitance switchcores, and other forms thereof are known in the art that can be made with the intertrace capacitive coupling feature of the present invention. Also, movable plate switchcores can incorporate the intratrace capacitance coupling of this invention, singly or combined with intertrace capacitance coupling.

The capacitance membrane switchcores of the invention are designed particularly for use as an operative element of a keyboard. Any appropriate structure can be utilized for the keys, and several types are described herein. The keys 7 in the keyboard illustrated in FIGS. 1 and 2 are supported from a top panel of a housing and are combined with an elastomeric domed element, whereby individual domes are depressed upon an actuation of a key. An alternative style of key structure is illustrated schematically in FIG. 27 comprising a key 7 supported along a cover 2 of a housing 4 and incorporating a spring 139 around the stem of the key above the cover. The distal end of the key carries a key cell element such as contact 10, and a capacitance membrane switchcore, such as switchcore 12a, is supported along base 3 of the housing. This type of construction eliminates elastomeric domed element 8 of the FIGS. 1 and 2. As a third alternative, the key areas of a keyboard also can be defined by graphics printed on the outer surface of a flat upper film, such as film 122 illustrated in connection with switchcore 12b of FIG. 23, if it is desired to eliminate reciprocable keys such as the keys 7. Still further, a top film such as film 122 may be thermoformed so as to include a dome 124 at each individual key site as shown in dashed line in FIG. 23. Still other suitable key or key pad structures will be apparent to those skilled in the art of membrane switch construction.

Figure 28:
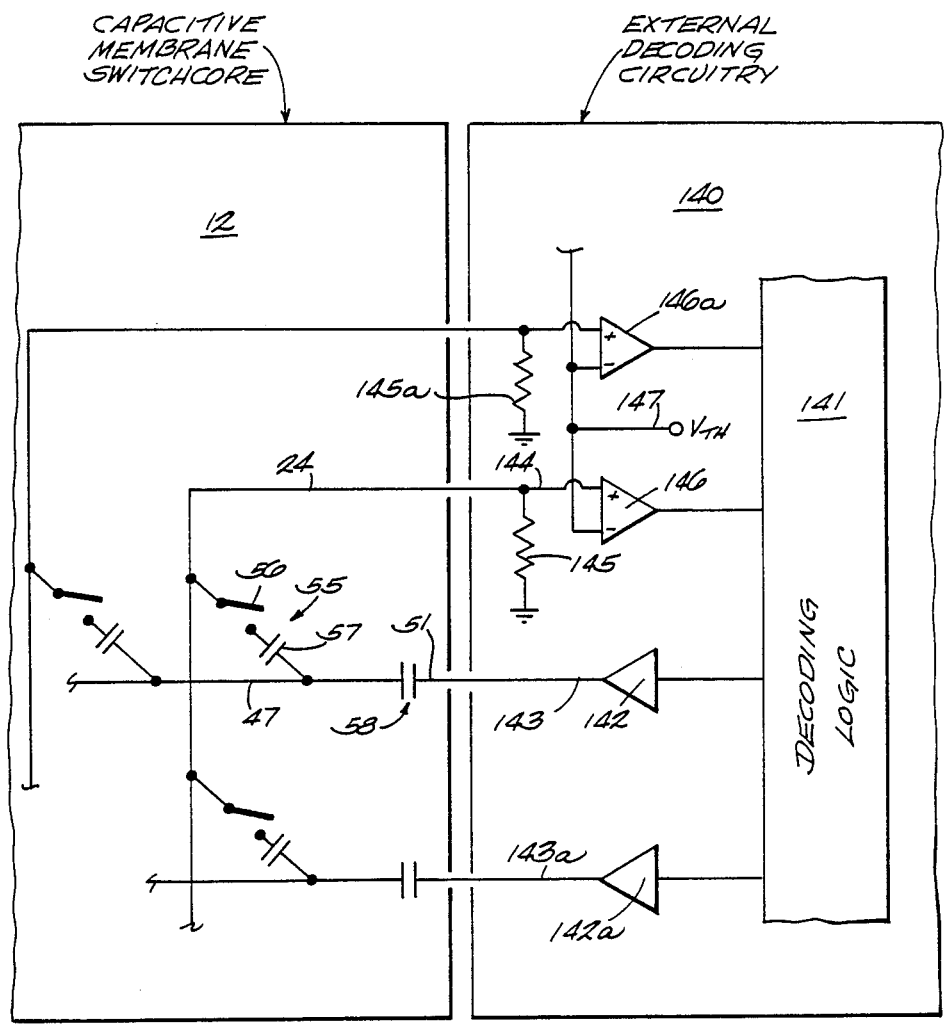
FIG. 28 is an electrical schematic of external decoding circuitry that may be associated with a capacitance membrane switchcore of the present invention.

(h) Matrix decoding, FIG. 28

As mentioned previously, the capacitive membrane switchcores described above are decoded by connection to external decoding circuitry. As an example, FIG. 28 illustrates switchcore 12 connected to external decoding circuitry 140. The external decoding circuitry 140 includes decoding logic represented at 141 which may include, for example, a microprocessor (not shown) and other devices well known in the art for interfacing to the decoding components described below. During a sampling cycle, the decoding logic 141 commands a drive amplifier 142 to produce a pulse, or voltage step, on a drive line 143. It should be understood that the external decoding circuitry 140 actually contains a plurality of drive amplifiers represented by 142a and drive lines represented by 143a, one for driving each row in the capacitive membrane switchcore 12. As is generally practiced in the art, when a pulse is produced by one drive amplifier 142, the other drive amplifiers 142a are held in a low impedance state to limit undesired coupling. The drive line 143 is connected to third trace 51 on the capacitive membrane switchcore 12, and is capacitively coupled through intertrace coupling capacitor 58 to second trace 47. In this configuration then, the second trace 47 is configured as a drive line, connected to a plurality of key cells 55, one of which is represented in FIG. 28 by key cell switch 56 and key cell capacitor 57. If the key cell switch 56 is open, then the pulse on second trace 47 is substantially blocked from further passage. If, on the other hand, key cell switch 56 is closed, then the pulse is capacitively coupled through key cell capacitor 57 onto one of the conductive first traces, for example, first trace 24. As with the second trace 47, first trace 24 interconnects to a plurality of other key cell locations, and is configured as a column. First trace 24 then connects to a sense line 144 back on the external decoding circuitry 140. The sense line 144 is loaded by a load resistor 145. The value of load resistor 145 should be high enough to prevent excessive loading of the respective lines 24, 47, and 51, and to provide a large enough time constant for the "high pass" filter formed by key cell capacitor 57 and load resistor 145. Note that as discussed above, the intertrace coupling capacitor 58 is usually substantially larger than key cell capacitor 57, and so should not materially affect that time constant. Load resistor 145 thereby serves to develop a voltage corresponding to the generated drive pulse on sense line 144, which is connected to one input of an analog comparator 146. It should be understood that a plurality of other load resistors 145a and analog comparators 146a are included for sensing the other columns (first traces 21-23, 25-34 and 65) of the switchcore 12. The other input of analog comparator 146 is connected to a threshold voltage 147. The threshold voltage 147 is selected such that in a worst case condition (all key cells activated), the output of analog comparator 146 will be true if the key cell switch 56 is closed, and false if it is open. The output of analog comparator 146 is connected to decoding logic 141 for sensing of the comparator state. It should be noted that even if the key cell switch 56 is open, the application of a drive signal will result in a small amount of leakage onto first trace 24 due to unavoidable parasitic capacitance of the open key cell switch 56. This produces a voltage spike of short duration on the load resistor 145. To overcome this problem, there is a delay of approximately 25-30 microseconds between the generation of the drive signal and the sensing of the output of comparator 146. In that way, the transitory voltage spike from an open key cell switch 56 will have decayed to below the threshold value before the output of analog comparator 146 is sensed. On the other hand, a true switch closure will result in a time constant much longer, long enough to hold the output across load resistor 145 above the threshold value 147 for a long enough time to be sensed by the decoding logic 141.

The type of decoding just described is generally known in the art and illustrates the compatibility of a switchcore of this invention with conventional decoding techniques. It should therefore be apparent to those skilled in the art that many other types of decoding are equally applicable to this invention including capacitive loading and integrating decoders. It should further be noted that the intertrace coupling capacitor 58 could equally have been placed in series with first trace 24, thereby placing the intertrace coupling capacitor 58 in the sense line instead of in the drive line. As discussed above, that configuration places less stringent demands on the intertrace coupling capacitor 58, since it is not required to carry the drive current for multiple key cells, as in the configuration shown in FIG. 28. Even further, if desired for trace routing or other purposes, the capacitive membrane switchcore 12 may include intertrace coupling capacitors 58 both in the drive line and in the sense line (not shown), without degradation of decoding ability.

(i) Materials of Construction

The capacitance membrane switchcores 12, 12a, 12b, 12c and 12c' described above are to be made with flexible plastic films for various strata of the constructions. Substrate 14 of switchcore 12, spacer layer 110 and top film 111 of the embodiment of FIG. 21, and upper film 120 and lower film 121 of switchcore 12b can be made of any of the nonconductive flexible plastic films suitable for flexible membrane switches. Polyester films, such as polyetheylene terephthalate films, are the most commonly used materials, but polycarbonate films, polyimide films, polysulfon films, polyolefin films and unplasticized polyvinyl chloride films also may be used. Films such as layers 14, 110, 111, 120 and 121 can be in the range of 1 to 15 mils thick (0.025 to 0.4 mm thick), or thicker if so desired, with films about 5 mils thick (0.13 mm thick) being preferred as providing physical properties appropriate to most flexible membrane switchcore applications at a reasonable cost. The dielectric film layer 13, and also film layer 155, is to comprise a layer of nonconductive flexible plastic film, such as polyester film (usually polyethylene terephthlate film), polycarbonate film, polyvinyl fluoride film, polyvinylidene fluoride film, or a polyolefin film. Suitable materials are available commercially from a number of companies, including Dupont and General Electric. Because the film layers 13 and 155 are to form all or part of one or more dielectric layers of a capacitance switchcore, it is most useful that the layer be quite thin so as to provide for high capacitance values; for this reason, capacitor grade plastic films of about 0.1 mil to 5 mils thick (0.002 to 0.13 mm thick) are generally most useful, with a film about 0.25 to 1.0 mil thick (0.006 to 0.025 mm thick) preferred for most applications.

The first circuit 16, second circuit 17 and third circuit 49 can be applied to the appropriate film surfaces by screen printing techniques or by vacuum deposition techniques. When screen printing is employed, the circuits are printed with suitable conductive inks containing silver, gold or other appropriate metal powders dispersed in an appropriate binder to form the selected pattern. Many suitable conductive inks are known in the art and are commercially available. A particularly useful system for printing the circuits is by use of inks having a high resistance as described and claimed in my copending U.S. patent application Ser. No. 07/262,568, filed on Oct. 25, 1988 which also is assigned to W. H. Brady Co., entitled Membrane Switchcores with High Resistivity Ink Circuits. When the circuits are applied by vacuum deposition, such as by sputtering, conductive metal such as silver, gold, aluminum or copper can be applied onto the film surfaces to form the circuits.

A structural adhesive layer such as adhesive layer 15 employed to laminate dielectric film 13 to substrate 14 or when used as a spacer layer 110 or 124 may comprise a layer of nonconductive heat activated adhesive, thermoset adhesive, or pressure sensitive adhesive. Many suitable adhesives are well known in the art and a specific adhesive should be selected with regard to the particular materials employed for the film layers so as to obtain the bonding strength required. The adhesive layer may be of any selected thickness, with a thickness in the range of 0.1 to 5 mils (0.002 to 0.13 mm) being suitable for most switchcores, although the layer can be thicker if so desired.

A particular advantage of the intertrace coupling and intratrace coupling features of the present invention is that capacitance membrane switchcores can be made employing these useful features without the need for any special materials or unusual or additional manufacturing steps. In fact, manufacturing steps such as die-cutting a dielectric layer, or pattern printing adhesive layers, to form apertures for interconnecting circuits are eliminated by the invention, thereby facilitating web processing manufacture. Thus the invention, in both of its aspects, can be practiced by known manufacturing techniques currently employed in the art of flexible membrane switch construction.

(j) Conclusion

A capacitance membrane switchcore made according to the present invention may incorporate only intertrace capacitive coupling such as described above, or may incorporate intertrace capacitive coupling combined with intratrace capacitive coupling, or may incorporate only intratrace capacitive coupling. Thus intertrace capacitive coupling and intratrace capacitive coupling may be used singly or in combination, depending upon the design objectives of a specific construction.

A number of advantages of intertrace capacitive coupling of the invention have been discussed in the detailed description set forth above, and there are additional advantages to be taken into consideration. The intertrace capacitive coupling provides a lower cost system for coupling two circuits on opposite sides of a dielectric layer as compared to the techniques currently employed in the art. Prior art techniques utilize die cut feed through holes extending through one or more layers to make interconnections between circuits, or so-called printed through holes for interconnections between layers, and some also involve folding one layer around the edge of another layer in order to achieve the same objectives. Each of these prior art systems, however, requires processing steps not needed in a switchcore incorporating intertrace capacitive coupling of the invention, so that intertrace capacitive coupling thereby leads to lower manufacturing costs and also typically results in an increase in yield, which is another factor affecting manufacturing costs. Secondly, the intertrace capacitive coupling feature of the invention enables increased registration tolerance, which is a significant factor allowing for reduced manufacturing costs since it is easier to construct a switchcore with the appropriate registration between circuits when registration tolerance is increased in comparison to prior art constructions that require close tolerances. The accuracy of registration or acceptable tolerance can be defined in a switchcore incorporating the intertrace capacitive coupling feature by oversizing one capacitor relative to the other. Also, only one circuit printing pass needs to be registered relative to a previously printed circuit pattern, so that the tolerance build-up problem that may be encountered with prior multiple pass switchcore constructions is eliminated. Another feature resulting from the increased registration tolerance is that the construction facilitates printing multiple sets of circuits at one time, such as printing several circuits side-by-side simultaneously on plastic film. The intertrace capacitive coupling feature also facilitates printing the respective circuits on a web of plastic film as well as on a sheet of plastic film, so that the manufacturing is not restricted to printing on sheets of film as is the case with some of the prior art constructions, such as constructions that require registered die-cutting. Additionally, as described above, all of the traces that need to be connected to external circuitry in a switchcore incorporating intertrace capacitive coupling of the invention are located on the same surface of the structure. This feature makes it easier to make the connection of external circuitry to the tail, or other portion selected for connection, than is the case with prior art constructions that incorporate traces on two or more surfaces to which connections must be made. This feature also makes it easier to die-cut the plastic film to form a tail since it eliminates the necessity for die cutting tails on two separate films and the problem of registering the tail of one film with the tail of the other. This is advantageous in that it aids in reduced manufacturing costs, such as by eliminating process steps and increasing yield. Intertrace capacitive coupling provides the further advantage of obtaining lower impedance when the concept is employed by running a lower trace under an upper trace, such as described above in connection with FIGS. 17-19 which can be an important advantage in some constructions.

Intratrace capacitive coupling according to the invention also provides significant advantages in the construction or manufacture of capacitance membrane switchcores. This concept enables the designer to run a trace from a first surface through one or more layers to a second surface and back to the first surface without die-cutting film or pattern printing to form through holes and provides a highly advantageous manner of enabling a trace to cross a plurality of other traces, which technique is not available in the prior art. This facilitates locating the position of traces in a circuit pattern, and thereby gives the designer a greater measure of freedom in the layout of the conductive patterns as compared to prior art techniques; this benefit is obtained at lower cost than conventional methods. This can be an especially important advantage when space limitations impose restrictions on the size of the membrane switchcore.

The foregoing enabling description of this invention, including the manner and process for making and using it, sets forth several exemplary constructions of capacitance membrane switchcores incorporating the concepts of my invention, but it will be apparent to those of ordinary skill in the art that the exemplary embodiments can be modified in various ways and yet result in a switchcore within the scope of this invention and it is therefore intended that the appended claims encompass all modifications of the disclosed embodiments that are within the true spirit and scope of the invention.

I claim:

1. A capacitance membrane switchcore for a keyboard having a plurality of operator actuatable key sites and including drive circuitry and sense circuitry to be connected to the switchcore, the capacitance membrane switchcore comprising (i) a dielectric layer, (ii) a conductive first circuit along a first surface of the dielectric layer that includes a plurality of conductive first traces and a plurality of first capacitor plates, (iii) a conductive second circuit along a second surface of the dielectric layer opposite from the first surface thereof that includes a plurality of conductive second traces and a plurality of second capacitor plates, and (iv) the first traces and the second traces are arranged relative to each other so as to define a matrix comprising a plurality of key cells, each including a fixed capacitor consisting of a first capacitor plate and a second capacitor plate that is unique to each key cell, the improvement wherein the capacitance membrane switchcore further includes:

a conductive third circuit along the same surface of the dielectric layer as the first circuit and including a plurality of conductive third traces, there being one third trace for each second trace of the second circuit;

an intertrace coupling capacitor coupling each second trace of the second circuit to a selected third trace of the third circuit, there being one intertrace coupling capacitor for each second trace, each intertrace coupling capacitor including a capacitor plate along the same surface of said dielectric layer as the second circuit and a capacitor plate along the same surface of said dielectric layer as the third circuit; and the first traces and third traces are arranged for connection to drive circuitry and sense circuitry of a keyboard.

2. A capacitance membrane switchcore according to claim 1, wherein:

at least one intertrace coupling capacitor includes (i) a third capacitor plate connected to a third trace and (ii) a fourth capacitor plate connected to a second trace and registered with said third capacitor plate.

3. A capacitance membrane switchcore according to claim 2, wherein:

said intertrace coupling capacitor further includes at least a portion of the third trace and at least a portion of the second trace in registry therewith.

4. A capacitance membrane switchcore according to claim 1, wherein:

at least one intertrace coupling capacitor includes (i) at least a portion of a third trace, and (ii) at least a portion of a second trace registered therewith to provide coextensive third trace and second trace portions along the first and second surfaces, respectively, of the dielectric layer that define the capacitor plates of the intertrace coupling capacitor.

5. A capacitance membrane switchcore according to claim 1, wherein:

the switchcore is of the open type in which the first surface of the dielectric layer is an exterior surface of the switchcore.

6. A capacitance membrane switchcore according to claim 1, wherein:

the switchcore is of the closed type and further includes (a) a spacer layer over the first surface of the dielectric layer and including a plurality of apertures arranged with one aperture surrounding each key cell of the matrix, and (b) a top layer of flexible plastic film joined to the spacer layer and including a plurality of conductive key cell elements along its bottom surface facing the dielectric layer, there being a key cell element located within each aperture of the spacer layer.

7. A capacitance membrane switchcore according to claim 1, wherein:

the switchcore is of the closed type, and (a) the dielectric layer includes a plurality of apertures arranged with one aperture surrounding each key cell of the matrix;

(b) a top layer of flexible plastic film is joined to a surface of the dielectric layer, the second circuit is defined along the surface of the said film facing the dielectric layer, and the second circuit includes (i) a contact within the aperture at each key cell and (ii) a floating second capacitor plate at each key cell adjacent each aperture;

(c) the first circuit includes (i) a contact within the aperture at each key cell, (ii) a pair of first capacitor plates at each key cell adjacent each aperture arranged with one first capacitor plate electrically connected to a first trace and the other first capacitor plate electrically connected to the contact; and (d) the floating second capacitor plate at each key cell is registered with the pair of first capacitor plates at each key cell.

8. A capacitance membrane switchcore according to claim 7, wherein:

the upper surface of the dielectric layer is joined to the top layer of flexible plastic film, and the first and third circuits are located along the lower surface of the dielectric layer opposite from the said film.

9. A capacitance membrane switchcore according to claim 1, wherein:

each key cell of the matrix further includes a pair of stationary contacts in series with the fixed capacitor at a key cell.

10. A capacitance membrane switchcore according to claim 1, wherein:

each key cell of the matrix further includes at least one plate of a variable capacitor in series with the fixed capacitor at a key cell.

11. A capacitance membrane switchcore according to claim 1, wherein:

the first and second capacitor plates at a key cell are shaped such that the net area of overlap between the first and second capacitor plates is invariant under lateral misalignment.

12. A capacitance membrane switchcore according to claim 11, wherein:

the first capacitor plate and second capacitor plate of at least one key cell of the matrix are each rectangular in shape and oriented relative to each other with their longer sides orthogonal.

13. A capacitance membrane switchcore according to claim 11, wherein:

at least one of the first or second capacitor plates at a key cell of the matrix comprises a conductive peripheral area surrounding a non-conductive central zone.

14. A capacitance membrane switchcore according to claim 11, wherein:

at least one of the fixed capacitors at a key cell includes first and second capacitor plates of different sizes, and the smaller capacitor plate includes a conductive tab portion placed symmetrically with respect to the trace connected to said smaller capacitor plate.

15. A capacitance membrane switchcore according to claim 14, wherein:

the smaller capacitor plate includes a plurality of tabs extending from the periphery thereof and placed such that each tab is symmetrical to one of the other tabs, each tab extends beyond the area of overlap of the larger plate, and the trace connected to said smaller capacitor plate is connected to one of the tabs.

16. A capacitive membrane switchcore according to claim 1, wherein:

the first traces are arranged for connection to drive circuitry and the third traces are arranged for connection to sense circuitry.

17. A capacitance membrane switchcore according to claim 1, wherein:

the third traces are arranged for connection to drive circuitry and the first traces are arranged for connection to sense circuitry.

18. A capacitive membrane switchcore according to claim 17, wherein:

the value of each intertrace coupling capacitor is approximately equal to the product of 1.3 times the number of key cells connected to the associated second trace times the value of each individual fixed capacitor of said number of key cells.

19. A capacitance membrane switchcore according to any one of claims 1-18 wherein:

the dielectric layer consists of a layer of flexible plastic film, the first and third circuits are applied along a first surface of the film, and the second circuit is applied along a second surface of the film opposite from the first surface thereof.

20. A capacitance membrane switchcore according to any one of claims 1-18 wherein:

the switchcore comprises a first plastic film having a surface joined by a layer of nonconductive adhesive to a surface of a plastic film substrate, the first plastic film and the adhesive define the dielectric layer, the first and third circuits are applied along the surface of the first plastic film opposite from its surface joined to the film substrate, and the second circuit is applied to the surface of the film substrate joined to the first plastic film.

21. A capacitance membrane switchcore for a keyboard having a plurality of operator actuatable key sites and including drive circuitry and sense circuitry to be connected to the switchcore, the capacitance membrane switchcore comprising (i) a dielectric layer, (ii) a conductive first circuit along a first surface of the dielectric layer that includes a plurality of conductive first traces and a plurality of first capacitor plates, (iii) a conductive second circuit along a second surface of the dielectric layer opposite from the first surface thereof that includes a plurality of conductive second traces and a plurality of second capacitor plates, and (iv) the first traces and the second traces are arranged relative to each other so as to define a matrix comprising a plurality of key cells, each including a fixed capacitor consisting of a first capacitor plate and a second capacitor plate that is unique to each key cell, the improvement wherein the capacitance membrane switchcore further includes: at least one trace of the first or second circuit that comprises (1) a first branch along the one surface of the dielectric layer,
(2) a second branch along the opposite surface of the dielectric layer,
(3) an intratrace coupling capacitor coupling the first branch to the second branch,
(4) a third branch along the said one surface of the dielectric layer, and
(5) an intratrace coupling capacitor coupling the second branch to the third branch.

22. A capacitance membrane switchcore according to claim 21, wherein:

a first trace of the first circuit includes a first branch along the first surface of the dielectric layer, a second branch along the second surface of the dielectric layer, and a third branch along the first surface of the dielectric layer.

23. A capacitance membrane switchcore for a keyboard having a plurality of operator actuatable key sites and including drive circuitry and sense circuitry to be connected to the switchcore, the capacitance membrane switchcore comprising (i) a dielectric layer, (ii) a conductive first circuit along a first surface of the dielectric layer that includes a plurality of conductive first traces and a plurality of first capacitor plates, (iii) a conductive second circuit along a second surface of the dielectric layer opposite from the first surface thereof that includes a plurality of conductive second traces and a plurality of second capacitor plates, and (iv) the first traces and the second traces are arranged relative to each other so as to define a matrix comprising a plurality of key cells, each including a fixed capacitor consisting of a first capacitor plate and a second capacitor plate that is unique to each key cell, the improvement wherein the capacitance membrane switchcore further includes:

a conductive third circuit along the same surface of the dielectric layer as the first circuit and including a plurality of conductive third traces, there being one third trace for each second trace of the second circuit;

an intertrace coupling capacitor coupling each second trace of the second circuit to a selected third trace of the third circuit, there being one intertrace coupling capacitor for each second trace, each intertrace coupling capacitor including a capacitor plate along the same surface of said dielectric layer as the second circuit and a capacitor plate along the same surface of said dielectric layer as the third circuit; and the first traces and third traces are arranged for connection to drive circuitry and sense circuitry of a keyboard; and the first circuit includes at least one first trace that comprises (1) a first branch along the first surface of the dielectric layer,
(2) a second branch along the second surface of the dielectric layer,
(3) an intratrace coupling capacitor coupling the first branch to the second branch,
(4) a third branch along the first surface of the dielectric layer, and
(5) an intratrace coupling capacitor coupling the second branch to the third branch.

24. A capacitance membrane switchcore according to claim 23 wherein:

at least one intertrace coupling capacitor includes (i) a third capacitor plate connected to a third trace and (ii) a fourth capacitor plate connected to a second trace and registered with said third capacitor plate.

25. A capacitance membrane switchcore according to claim 24, wherein:

said intertrace coupling capacitor further includes at least a portion of the third trace and at least a portion of the second trace in registry therewith.

26. A capacitance membrane switchcore according to claim 23, wherein:

at least one intertrace coupling capacitor includes (i) at least a portion of a third trace, and (ii) at least a portion of a second trace registered therewith to provide coextensive third trace and second trace portions along the first and second surfaces, respectively, of the dielectric layer that define the capacitor plates of the intertrace coupling capacitor.

27. A capacitance membrane switchcore according to claim 23, wherein:

the switchcore is of the open type in which the first surface of the dielectric layer is an exterior surface of the switchcore.

28. A capacitance membrane switchcore according to claim 23, wherein:

the switchcore is of the closed type and further includes
(a) a spacer layer over the first surface of the dielectric layer and including an aperture surrounding each key cell of the matrix, and
(b) a top layer of flexible plastic film joined to the spacer layer and including a plurality of conductive key cell elements along its bottom surface facing the dielectric layer, there being a key cell element located within each aperture of the spacer layer.

29. A capacitance membrane switchcore according to claim 23, wherein:
the switchcore is of the closed type, and
(a) the dielectric layer includes a plurality of apertures arranged with one aperture surrounding each key cell of the matrix;
(b) a top layer of flexible plastic film is joined to a surface of the dielectric layer, the second circuit is defined along the surface of the said film facing the dielectric layer, and the second circuit includes (i) a contact within the aperture at each key cell and (ii) a floating second capacitor plate at each key cell adjacent each aperture;
(c) the first circuit includes (i) a contact within the aperture at each key cell, (ii) a pair of first capacitor plates at each key cell adjacent each aperture arranged with one first capacitor plate electrically connected to a first trace and the other first capacitor plate electrically connected to the contact; and
(d) the floating second capacitor plate at each key cell is registered with the pair of first capacitor plates at each key cell.

30. A capacitance membrane switchcore according to claim 23, wherein
each key cell of the matrix further includes a pair of stationary contacts in series with the fixed capacitor at a key cell.

31. A capacitance membrane switchcore according to claim 23, wherein
each key cell of the matrix further includes at least one plate of a variable capacitor in series with the fixed capacitor at a key cell.

32. A capacitance membrane switchcore according to claim 23, wherein:
the first traces are arranged for connection to one of the drive circuitry and sense circuitry of a keyboard, and the third traces are arranged for connection to the other of the drive circuitry and sense circuitry of a keyboard.

33. A capacitance membrane switchcore according to any one of claims 23–32 wherein:
the dielectric layer consists of a layer of flexible plastic film, the first and third circuits are applied along a first surface of the film, and the second circuit is applied along a second surface of the film opposite from the first surface thereof.

34. A capacitance membrane switchcore according to any one of claims 23–32 wherein:
the switchcore comprises a first plastic film having a surface joined by a layer of nonconductive adhesive to a surface of a plastic film substrate, the first film and the adhesive define the dielectric layer, the first and third circuits are applied along the surface of the first film opposite from its surface joined to the film substrate, and the second circuit is applied to the surface of the film substrate joined to the first film.

35. A capacitance membrane switchcore for a keyboard having a plurality of operator actuatable key sites and including drive circuitry and sense circuitry to be connected to the switchcore, the capacitance membrane switchcore comprising (i) a dielectric layer, (ii) a conductive first circuit along a first surface of the dielectric layer that includes a plurality of conductive first traces, (iii) a conductive second circuit along a second surface of the dielectric layer opposite from the first surface thereof that includes a plurality of conductive second traces and a plurality of second capacitor plates, and (iv) the first traces and the second traces are arranged relative to each other so as to define a matrix comprising a plurality of key cells,
the improvement comprising:
said first circuit including (i) a plurality of capacitor driven plates electrically connected to each first trace, there being one capacitor driven plate at each key cell of the matrix, and (ii) a plurality of first capacitor plates electrically independent of the capacitor driven plates, there being one first capacitor plate at each key cell of the matrix, and each first capacitor plate is registered with a selected second capacitor plate to provide a fixed capacitor that is unique to each key cell of the matrix;
each operator actuatable key site includes a movable capacitor plate adapted to form a variable capacitor with the capacitor driven plate and the first capacitor plate at a key cell;
a conductive third circuit along the same surface of the dielectric layer as the first circuit and including a plurality of conductive third traces, there being one third trace for each second trace of the second circuit;
an intertrace coupling capacitor coupling each third trace to a second trace to capacitively couple each second trace of the second circuit to a selected third trace of the third circuit; and
the first traces are arranged for connection to one of the drive circuitry and sense circuitry of a keyboard, and the third traces are arranged for connection to the other of the drive circuitry and sense circuitry of a keyboard.

36. A capacitance membrane switchcore according to claim 35, wherein:
each operator actuatable key site includes a movable capacitor plate covered by dielectric material, and the capacitor driven plate and first capacitor plate at each key cell of the matrix are contacted by the dielectric material upon actuation of a key site.

37. A capacitance membrane switchcore according to claim 35, wherein:
the switchcore further includes an upper dielectric layer covering the first and third circuits; and each operator actuatable key site includes a movable capacitor plate which contacts the upper dielectric layer upon actuation of a key site.

38. In a capacitance membrane switchcore of the type including conductive first and second circuits including conductive traces along opposed surfaces of a dielectric layer, the circuits defining a matrix comprising a plurality of key cells and adapted for combining with a data entry keyboard including drive circuitry and sense circuitry,
the improvement wherein:

the switchcore further includes (i) a conductive third circuit including conductive third traces along the same surface of said dielectric layer as one of the first and second circuits, and (ii) an intertrace coupling capacitor coupling each third trace with a selected one trace of the other of the first and second circuits, the intertrace coupling capacitor comprising capacitor plates along opposed surfaces of said dielectric layer.

39. In a capacitance membrane switchcore of the type including conductive first and second circuits including conductive traces along opposed surfaces of a dielectric layer, the circuits defining a matrix comprising a plurality of key cells and adapted for combining with a data entry keyboard including drive circuitry and sense circuitry, the improvement wherein:

at least one conductive trace of the first and second circuits includes a first branch along one surface of the dielectric layer, a second branch along the opposite surface of the dielectric layer, a third branch along said one surface of the dielectric layer, and (i) a first intratrace coupling capacitor coupling the first branch to the second branch and (ii) a second intratrace coupling capacitor coupling the second branch to the third branch.

* * * * *

UNITED STATES PATENT AND TRADEMARK OFFICE
CERTIFICATE OF CORRECTION

PATENT NO.   : 4,857,684

DATED        : August 15, 1989

INVENTOR(S)  : Norman G. Gratke

It is certified that error appears in the above-identified patent and that said Letters Patent is hereby corrected as shown below:

Col. 5, line 44, delete "ay" and insert -- may --.

Col. 5, line 59, after "and" insert -- 38b --.

Signed and Sealed this

Twelfth Day of June, 1990

*Attest:*

HARRY F. MANBECK, JR.

*Attesting Officer*  *Commissioner of Patents and Trademarks*